US011837320B2

(12) United States Patent
Kang et al.

(10) Patent No.: US 11,837,320 B2
(45) Date of Patent: Dec. 5, 2023

(54) SEMICONDUCTOR CHIP AND VEHICLE COMPRISING THE SAME

(71) Applicant: SAMSUNG ELECTRONICS CO., LTD., Suwon-si (KR)

(72) Inventors: Young San Kang, Yongin-si (KR); Dong Hee Kim, Seoul (KR); Jong Kyu Choi, Incheon (KR); Sung Oh Huh, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/580,702

(22) Filed: Jan. 21, 2022

(65) Prior Publication Data

US 2022/0406346 A1 Dec. 22, 2022

(30) Foreign Application Priority Data

Jun. 16, 2021 (KR) .................. 10-2021-0077896

(51) Int. Cl.
*G11C 7/10* (2006.01)
*H03K 5/135* (2006.01)
*G11C 8/18* (2006.01)
*G11C 7/20* (2006.01)

(52) U.S. Cl.
CPC .......... *G11C 7/1093* (2013.01); *G11C 7/1066* (2013.01); *G11C 7/20* (2013.01); *G11C 8/18* (2013.01); *H03K 5/135* (2013.01)

(58) Field of Classification Search
CPC ....... G11C 7/1093; G11C 7/1066; G11C 7/20; G11C 8/18; H03K 5/135
See application file for complete search history.

(56) References Cited

U.S. PATENT DOCUMENTS

| 6,564,335 | B1 | 5/2003 | Freker |
| 8,692,596 | B1 | 4/2014 | Cooke |
| 9,251,873 | B1 | 2/2016 | Fox et al. |
| 9,356,772 | B2 | 5/2016 | Lee et al. |
| 9,479,183 | B1 * | 10/2016 | Chen ..................... H03L 7/0802 |
| 10,394,460 | B1 | 8/2019 | Patel |
| 10,613,995 | B2 * | 4/2020 | Yeung ................ H03K 19/1778 |
| 2019/0197006 | A1 | 6/2019 | Teh |

FOREIGN PATENT DOCUMENTS

KR 20020050730 A 6/2002

* cited by examiner

*Primary Examiner* — Vanthu T Nguyen

(74) *Attorney, Agent, or Firm* — Fish & Richardson P.C.

(57) ABSTRACT

A semiconductor chip capable of improving signal quality includes a host device, a first memory device which is spaced part from the host device and connected to the host device, a repeater module which is connected to the host device and the first memory device, and a second memory device which is spaced apart from the host device and connected to the repeater module. The first memory device receives a data signal from the host device and generates a recovery clock signal, using the data signal. The repeater module receives the recovery clock signal from the first memory device, receives a first input signal from the host device, and samples the first input signal on the basis of the recovery clock signal to generate a sampling signal. The second memory device receives the sampling signal.

19 Claims, 21 Drawing Sheets

SEMICONDUCTOR CHIP AND VEHICLE COMPRISING THE SAME

This application claims priority from Korean Patent Application No. 10-2021-0077896 filed on Jun. 16, 2021, in the Korean Intellectual Property Office, the disclosure of which is incorporated herein by reference in its entirety.

BACKGROUND

1. Field of the Disclosure

The present disclosure relates to a semiconductor chip and a vehicle including the same.

2. Description of the Related Art

Semiconductor memory devices include volatile memory devices and non-volatile memory devices. The volatile memory devices have fast read and write speeds, but may lose their stored contents when powered off. In contrast, since the non-volatile memory devices retain their stored contents even when powered off, the non-volatile memory devices are used to store contents that need to be retained, regardless of whether power is supplied.

For example, the volatile memory device includes a static random access memory (SRAM), a dynamic RAM (DRAM), a synchronous DRAM (SDRAM), and the like. The non-volatile memory devices retain their stored contents even when powered off. For example, the non-volatile memory device includes a ROM (read only memory), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), and the like. The flash memory may be classified into a NOR type flash memory and a NAND type flash memory.

A semiconductor chip for a mobile device may include an application processor and a volatile memory device connected to the application processor. In this case, the volatile memory device may be an LPDDR (low power double data rate) DRAM. When the LPDDR DRAM is used as a volatile memory device in a vehicle semiconductor chip, the LPDDR DRAM may be placed separately from the application processor. A clock signal sent from the application processor to the LPDDR DRAM may be distorted under the influence of the external environment, and therefore, a method capable of improving the performance of the clock signal is required.

SUMMARY

Aspects of the present disclosure provide a semiconductor chip capable of improving signal quality.

Aspects of the present disclosure also provide a vehicle including a semiconductor chip capable of improving signal quality.

However, aspects of the present disclosure are not restricted to the one(s) set forth herein. The above and other aspects of the present disclosure will become more apparent to one of ordinary skill in the art to which the present disclosure pertains by referencing the detailed description of the present disclosure given below.

According to an embodiment of the present disclosure, the semiconductor chip comprises a host device, a first memory device which is spaced part from the host device and connected to the host device, a repeater module which is connected to the host device and the first memory device, and a second memory device which is spaced apart from the host device and connected to the repeater module. The first memory device receives a data signal from the host device and generates a recovery clock signal using the data signal. The repeater module receives the recovery clock signal from the first memory device, receives a first input signal from the host device, and samples the first input signal on the basis of the recovery clock signal to generate a sampling signal. The second memory device receives the sampling signal.

According to an embodiment of the present disclosure, the semiconductor chip comprises a host device and a multi-chip package which is spaced apart from the host device and connected to the host device. The multi-chip package includes a first memory device, a second memory device different from the first memory device, and a first repeater module which is electrically connected to the first and second memory devices. The first memory device transmits a clock signal to the first repeater module. The first repeater module samples a first input signal from the host device on the basis of the clock signal to generate a sampling signal. The second memory device receives the sampling signal.

According to an embodiment of the present disclosure, the vehicle comprises an electronic control unit and a semiconductor chip which receives and stores data from the electronic control unit. The semiconductor chip includes a UFS memory device which is spaced apart from the electronic control unit and connected to the electronic control unit, a repeater module connected to the electronic control unit and the UFS memory device, and a DRAM device which is spaced apart from the electronic control unit and connected to the repeater module. The UFS memory device receives a data signal from the electronic control unit and generates a recovery clock signal using the data signal. The repeater module receives the recovery clock signal from the UFS memory device, receives an input signal from the electronic control unit, and samples the input signal on the basis of the recovery clock signal to generate a sampling signal. The DRAM device receives and processes the sampling signal.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION OF THE EMBODIMENTS

Hereinafter, embodiments according to the technical idea of the present disclosure will be described referring to the accompanying drawings.

Figure 1:
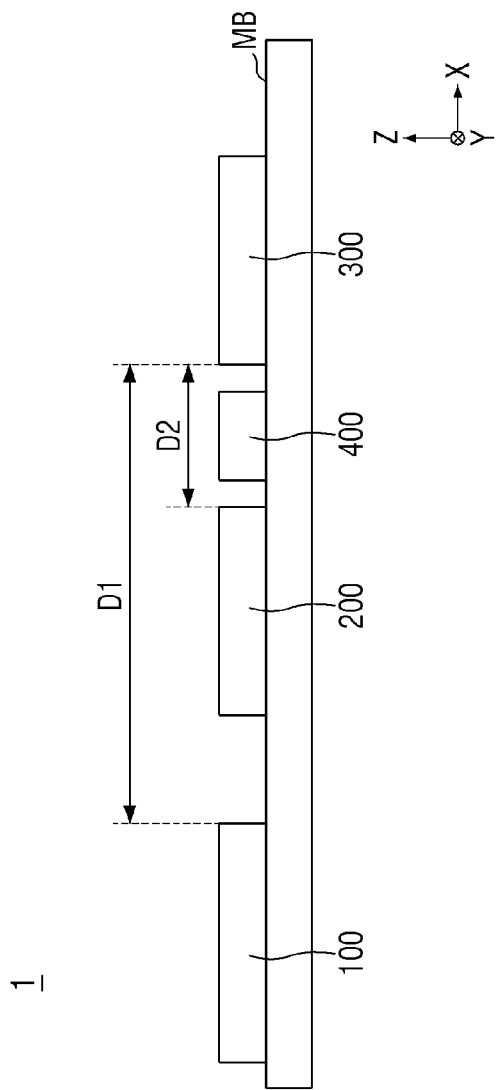
FIG. 1 is a side view of a semiconductor chip according to some embodiments.
Figure 2:
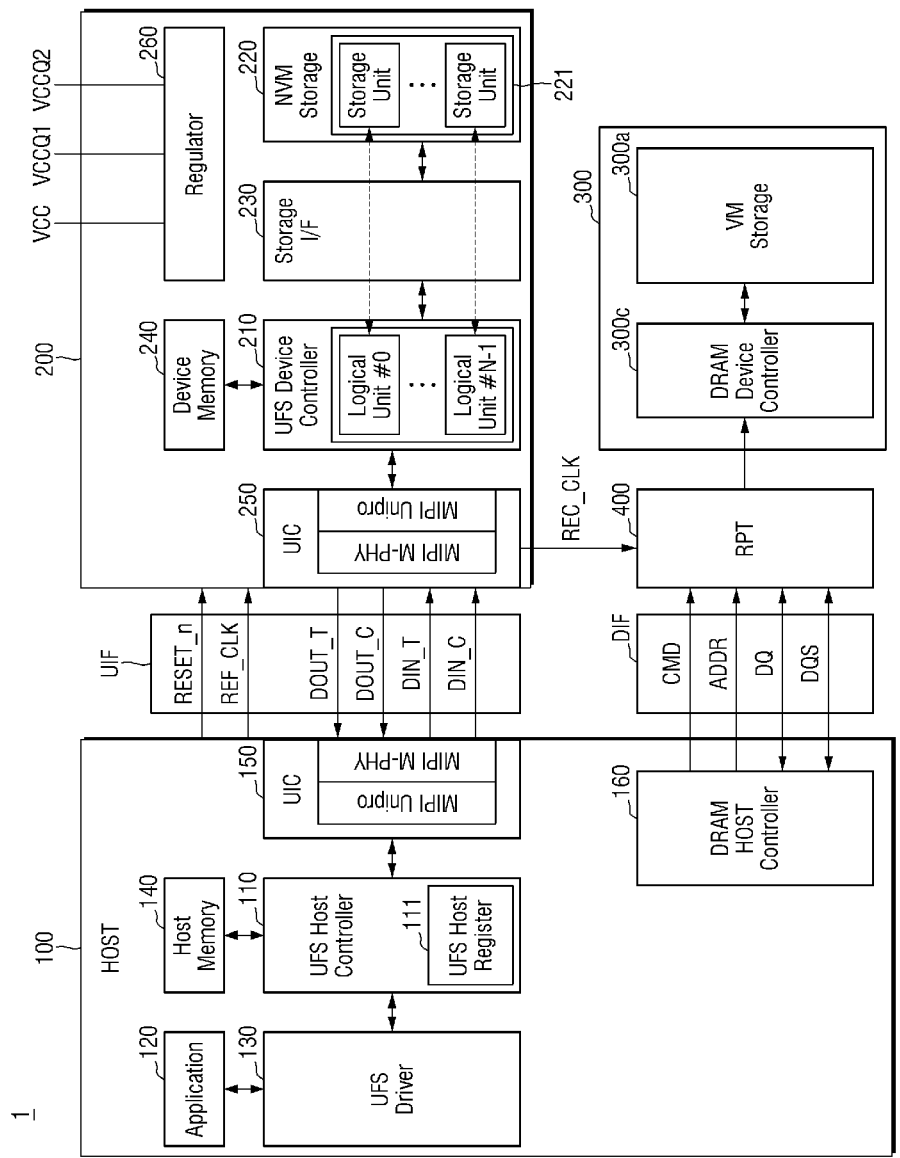
FIG. 2 is a block diagram for explaining the semiconductor chip according to some embodiments.
Figure 3:
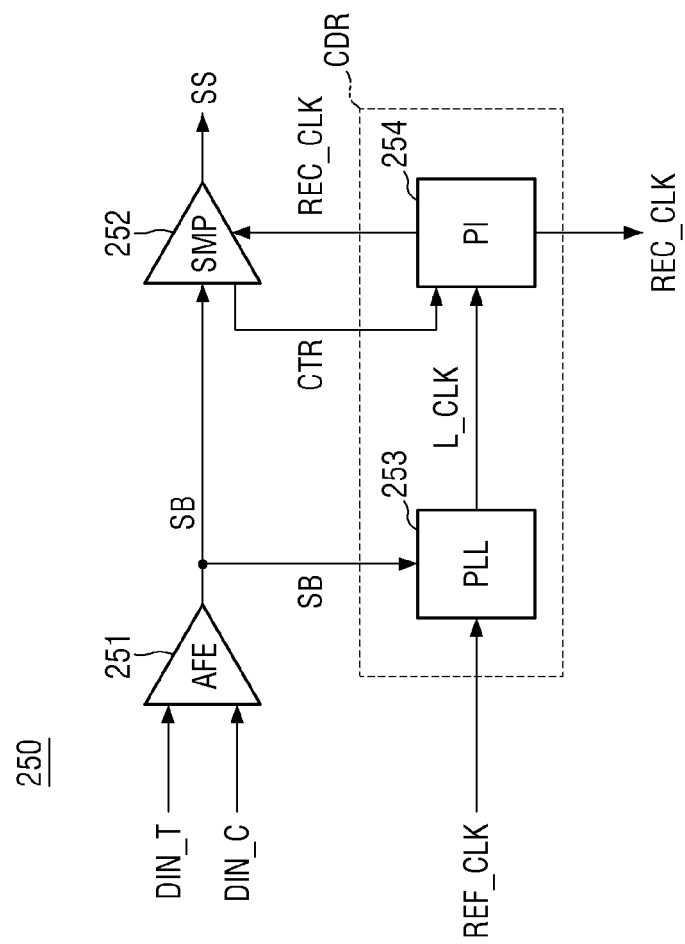
FIG. 3 is a block diagram of the UIC layer of FIG. 2.

FIG. 1 is a side view of a semiconductor chip according to some embodiments. FIG. 2 is a block diagram for explaining the semiconductor chip according to some embodiments. FIG. 3 is a block diagram of the UIC layer of FIG. 2.

Referring to FIG. 1, a semiconductor chip 1 may include a motherboard MB, a host device 100, a first memory device 200, a second memory device 300, and a repeater module 400.

The host device 100, the first memory device 200, the second memory device 300 and the repeater module 400 may be mounted on the motherboard MB. The host device 100, the first memory device 200, the second memory device 300 and the repeater module 400 may be electrically connected through the motherboard MB. Here, although the host device 100, the first memory device 200, the second memory device 300, and the repeater module 400 are shown as being placed in a row, the embodiment is not limited thereto.

The host device 100 may be placed separately from the first memory device 200, the second memory device 300, and the repeater module 400. For example, the host device 100 may be spaced apart from the second memory device 300 by a first distance D1. Further, the first memory device 200 and the second memory device 300 may be spaced apart from each other by a second distance D2. Here, the first distance D1 may be greater than the second distance D2. That is, the first memory device 200, the second memory device 300, and the repeater module 400 are placed close to each other, while the host device 100 may be placed apart from them.

Referring to FIG. 2, the host device 100 and the first memory device 200 may be connected to each other through the universal flash storage (UFS) interface UIF. In some embodiments, the host device 100 may be implemented as an application processor (AP). The first memory device 200 may be implemented as a UFS non-volatile memory device. However, the embodiments of the present disclosure are not limited thereto.

The host device 100 may include a UFS host controller 110, an application 120, a UFS driver 130, a host memory 140, and a UIC (UFS interconnect) layer 150.

The first memory device 200 may include a UFS device controller 210, a non-volatile storage 220, a storage interface 230, a device memory 240, a UIC layer 250 and a regulator 260.

The non-volatile storage 220 may include a plurality of storage units 221. The storage units 221 may include a V-NAND flash memory of a 2D structure or a 3D structure, but may also include other types of non-volatile memory such as a PRAM and/or an RRAM.

The UFS device controller 210 and the non-volatile storage 220 may be connected to each other through the storage interface 230. The storage interface 230 may be implemented to comply with standard protocols such as Toggle or ONFI.

The application 120 may mean a program that wants to communicate with the first memory device 200 in order to utilize the function of the first memory device 200. The application 120 may transmit an input-output request (IOR) to the UFS driver 130 for input/output of the first memory device 200. The input-output request (IOR) may mean, but is not necessarily limited to, a read request, a write request and/or an erase request of data, and the like The UFS driver 130 may manage the UFS host controller 110 through a UFS-HCI (host controller interface). The UFS driver 130 may convert the input-output request generated by the application 120 into UFS commands defined by the UFS standard and may send the converted UFS commands to the UFS host controller 110. A single input-output request may be converted into a plurality of UFS commands. The UFS commands basically may be commands defined by an SCSI (Small Computer System Interface) standard, but may also be UFS standard-only commands.

The UFS host controller 110 may transmit the UFS commands converted by the UFS driver 130 to the UIC layer 250 of the first memory device 200 through the UIC layer 150 and the UFS interface UIF. In this procedure, a UFS host register 111 of the UFS host controller 110 may serve as a command queue (CQ).

The UIC layer 150 on the host device 100 side may include a mobile industry processor interface (MIPI) M-PHY and an MIPI UniPro, and the UIC layer 250 on the first memory device 200 side may also include an MIPI M-PHY and an MIPI UniPro.

The UFS interface UIF may include a line that transmits a reference clock REF_CLK, a line that transmits a hardware reset signal RESET_n of the first memory device 200, a pair of lines that transmit differential input signal pairs DIN_T and DIN_C, and a pair of lines that transmit differential output signal pairs DOUT_T and DOUT_C.

A frequency value of a reference clock signal REF_CLK provided from the host device 100 to the first memory device 200 may be, but is not necessarily limited to, one of four values of 19.2 MHz, 26 MHz, 38.4 MHz and 52 MHz. The host device 100 may change the frequency value of the reference clock signal REF_CLK even during operation, that is, even while data transmission and reception are performed between the host device 100 and the first memory device 200.

The first memory device 200 may generate clock signals of various frequencies from the reference clock signal REF_CLK provided from the host device 100, by utilizing a phase-locked loop (PLL) or the like. Further, the host device 100 may set a value of a data rate between the host device 100 and the first memory device 200 through the frequency value of the reference clock signal REF_CLK. That is, the value of the data rate may be determined depending on the frequency value of the reference clock signal REF_CLK.

The UFS interface may support multiple lanes, and each lane may be implemented as a differential pair. For example, the UFS interface may include one or more receive lanes and one or more transmit lanes. In FIG. 2, the pair of lines that transmit the differential input signal pairs DIN_T and DIN_C may constitute the receive lane, and the pair of lines that transmit the differential output signal pairs DOUT_T and DOUT_C may constitute the transmit lane, respectively. Although one transmit lane and one receive lane are shown in FIG. 2, the number of transmit lanes and receive lanes may be modified.

The receive lane and the transmit lane may transmit the data in a serial communication manner, and a full-duplex type communication between the host device 100 and the first memory device 200 is enabled by a structure in which the receive lane and the transmit lane are separated. That is, the first memory device 200 may transmit data to the host device 100 through the transmit lane, even while receiving the data from the host device 100 through the receive lane. Also, control data such as a command from the host device 100 to the first memory device 200 and user data to be stored in the non-volatile storage 220 of the first memory device 200 or to be read from the non-volatile storage 220 by the host device 100 may be transmitted through the same lane. Accordingly, it is not necessary to provide further a separate lane for data transmission, in addition to the pair of transmit lanes and the pair of receive lanes, between the host device 100 and the first memory device 200.

Referring to FIG. 3, the UIC layer 250 of the first memory device 200 may include an equalizer 251 including an analog front end (AFE), a sampler 252, and a clock data recovery circuit CDR. The UIC layer 250 may include configurations other than those shown in FIG. 3.

The equalizer 251 receives differential input signal pairs DIN_T and DIN_C from the host device 100 and may perform equalizing to output serial bits SB. In some embodiments, the host device 100 provides differential input signal pairs DIN_T and DIN_C which are serial signals to the equalizer 251 and the equalizer 251 may output the serial bit SB from it. The serial bit SB may be sent to the clock data recovery circuit CDR and the sampler 252.

The clock data recovery circuit CDR may include a phase-locked loop circuit 253 and a phase interpolator 254. Here, the configuration of the clock data recovery circuit CDR is not limited to that shown. The clock data recovery circuit CDR may receive the reference clock signal REF_CLK from the host device 100, may receive the serial bit SB from the equalizer 251, and may perform a clock recovery using the received reference clock signal REF_CLK and the serial bit SB to generate a recovery clock signal REC_CLK.

The phase-locked loop circuit 253 may generate a locked clock signal L_CLK, using the received reference clock signal REF_CLK and the serial bit SB. That is, the phase-locked loop circuit 253 may recover the clock signal from the serial bit SB and generate a locked clock signal L_CLK in which the reference clock signal REF_CLK is adjusted. However, the embodiments of the present disclosure are not limited thereto.

The phase interpolator 254 may receive the locked clock signal L_CLK from the phase-locked loop circuit 253 and may generate the recovery clock signal REC_CLK on the basis thereof. The phase interpolator 254 may adjust the locked clock signal L_CLK to generate the recovery clock signal REC_CLK. Also, the phase interpolator 254 may be adjusted by a control signal CTR from the sampler 252. The phase interpolator 254 may output the generated locked clock signal L_CLK, which may be provided to the sampler 252.

The sampler 252 may sample the serial bits SB, by the use of the recovery clock signal REC_CLK. That is, the sampler 252 may extract data of the serial bit SB by the use of the recovery clock signal REC_CLK. The sampler 252 may sample the serial bit SB to generate a sampling signal SS. The sampling signal SS may be converted later through a deserializer. The sampling signal SS may be sent to the UFS device controller 210, the non-volatile storage 220 or the like of FIG. 2.

Referring to FIG. 2 again, the UFS device controller 210 of the first memory device 200 may generally control the operation of the first memory device 200. The UFS device controller 210 may include a flash translation layer (FTL) and may convert a logical data address sent from the host device 100, for example, an LBA (logical block address), into a physical data address, for example, a PBA (physical block address) or a PPN (physical page number), using the address mapping information of the FTL. When a command from the host device 100 is input to the first memory device 200 through the UIC layer 250, the UFS device controller 210 performs an operation according to the input command and may transmit the completion response to the host device 100 when the operation is completed.

For example, when the host device 100 tries to store the user data in the first memory device 200, the host device 100 may transmit a data write command to the first memory device 200. When a response which is ready to receive the user data (ready-to-transfer) is received from the first memory device 200, the host device 100 may transmit the user data to the first memory device 200. The UFS device controller 210 temporarily stores the transmitted user data in the device memory 240 and may store the user data temporarily stored in the device memory 240 at a selected position of the non-volatile storage 220 on the basis of the address mapping information of the FTL.

As still another example, when the host device 100 tries to read the user data stored in the first memory device 200, the host device 100 may transmit the data read command to the first memory device 200. When receiving the command, the UFS device controller 210 reads the user data from the non-volatile storage 220 on the basis of the data read command and may temporarily store the read user data in the device memory 240. In such a read procedure, the UFS device controller 210 may detect and correct errors of the read user data, using a built-in ECC (error correction code) circuit (not shown). Further, the UFS device controller 210 may transmit the user data temporarily stored in the device memory 240 to the host device 100.

The host device 100 may store the commands to be transmitted to the first memory device 200 in order within the UFS host register 111, which may function as a command queue, and transmit the commands to the first memory device 200 in that order. At this time, the host device 100 may transmit the next command waiting in the command queue to the first memory device 200, even when the previously transmitted command is still being processed by the first memory device 200, that is, even before receiving the notification that the previously transmitted command is completely processed by the first memory device 200. Accordingly, the first memory device 200 may also receive the next command from the host device 100, even while processing the previously transmitted command. The maximum number of commands (queue depth) that may be stored in such a command queue may be, for example, thirty two. Further, the command queue may be implemented as a circular queue type that indicates a start and an end of a command row stored in the queue through a head pointer and a tail pointer.

Each of the plurality of storage units 221 may include a memory cell array (not shown) and a control circuit (not shown) that controls the operation of the memory cell array. The memory cell array may include a two-dimensional memory cell array or a three-dimensional memory cell array. The memory cell array includes a plurality of memory cells and each memory cell may be a cell that stores 1-bit information (single level cell, SLC), but each memory cell may also be a cell that stores 2-bits or more information, such as an MLC (multi level cell), a TLC (triple level cell), and a QLC (quadruple level cell). A three-dimensional memory cell array may include a vertical NAND string which is vertically oriented so that at least one memory cell is located above another memory cell. More specific description thereof will be provided below.

VCC, VCCQ1, VCCQ2, and the like as power voltages may be input to the first memory device 200. VCC is a main power voltage for the first memory device 200 and may have, for example, a value of 2.4 to 3.6V. VCCQ1 is a power voltage for supplying voltage of a low range, is mainly for the UFS device controller 210, and may include, for example, a value of 1.14 and 1.26V. VCCQ2 is a power voltage for supplying a voltage of a range lower than the VCC but higher than the VCCQ1, is mainly for input-output interfaces such as the MIPI M-PHY, and may include, for example, a value of 1.7 to 1.95V. The aforementioned power voltages may be supplied for each component of the first memory device 200 via the regulator 260. The regulator 260 may be implemented as a set of unit regulators, each connected to different ones among the aforementioned power voltages.

Figure 4:
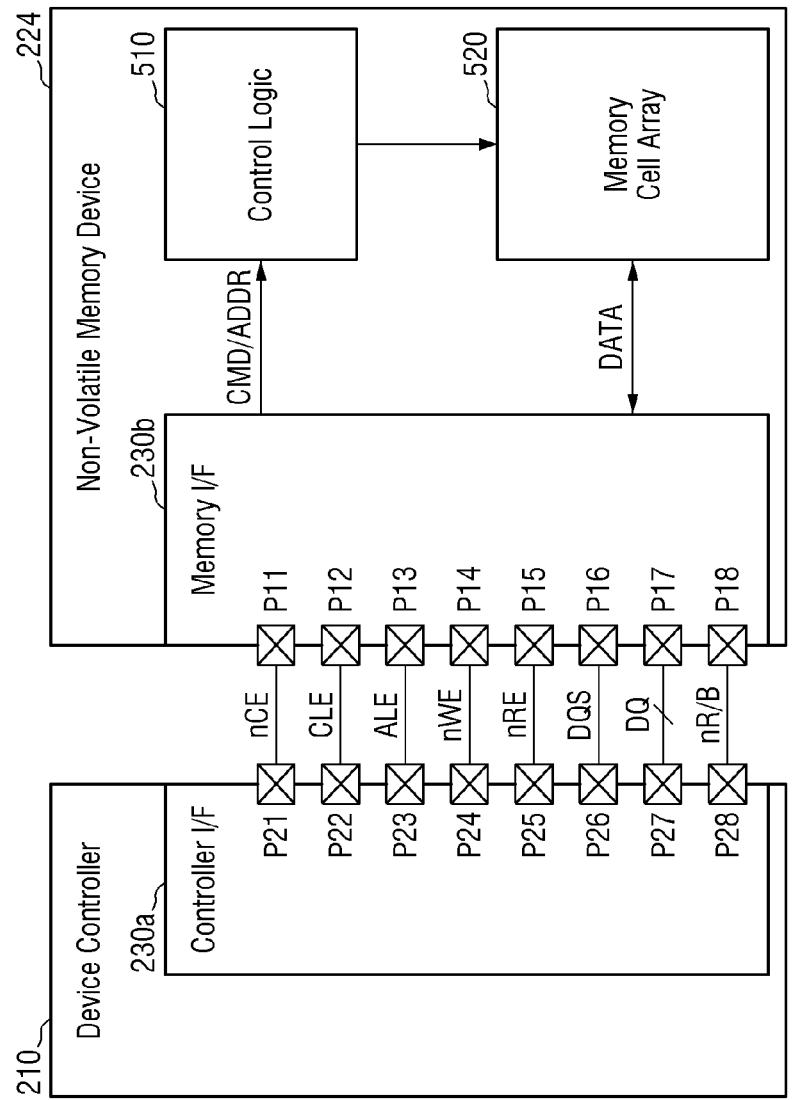
FIG. 4 is a diagram in which the UFS device controller and the non-volatile storage of FIG. 2 are reconfigured.

FIG. 4 is a diagram in which the UFS device controller and the non-volatile storage of FIG. 2 are reconfigured.

The storage interface 230 of FIG. 2 may include a controller interface circuit 230*a* and a memory interface circuit 230*b* of FIG. 4. In some embodiments, the storage device 224 shown in FIG. 4 may correspond to the single storage unit 221 of FIG. 2. Also, in some embodiments, the storage device 224 may correspond to the non-volatile storage 220 of FIG. 2.

The storage device 224 may include first to eighth pins P11 to P18, a memory interface circuit 230*b*, a control logic circuit 510, and a memory cell array 520.

The memory interface circuit 230*b* may receive a chip enable signal nCE from the UFS device controller 210 through a first pin P11. The memory interface circuit 230*b* may transmit and receive signals to and from the UFS device controller 210 through second to eighth pins P12 to P18 in accordance with the chip enable signal nCE. For example, when the chip enable signal nCE is in an enable status (e.g., a low level), the memory interface circuit 230*b* may transmit and receive signals to and from the UFS device controller 210 through second to eighth pins P12 to P18.

The memory interface circuit 230*b* may receive a command latch enable signal CLE, an address latch enable signal ALE, and a write enable signal nWE from the UFS device controller 210 through second to fourth pins P12 to P14. The memory interface circuit 230*b* may receive the data signal DQ from the UFS device controller 210 or transmit the data signal DQ to the UFS device controller 210 through a seventh pin P17. The command CMD, the address ADDR, and the data DATA may be sent through the data signal DQ. For example, the data signal DQ may be sent through a plurality of data signal lines. In this case, the seventh pin P17 may include a plurality of pins corresponding to the plurality of data signals.

The memory interface circuit 230*b* may acquire the command CMD from the data signal DQ received in an enable section (e.g., a high level status) of the command latch enable signal CLE on the basis of toggle timings of the write enable signal nWE. The memory interface circuit 230*b* may acquire the address ADDR from the data signal DQ received in the enable section (e.g., a high level status) of the address latch enable signal ALE on the basis of the toggle timings of the write enable signal nWE.

In some embodiments, the write enable signal nWE holds a static status (e.g., a high level or a low level) and then may toggle between the high level and the low level. For example, the write enable signal nWE may toggle at the section in which the command CMD or the address ADDR is transmitted. Accordingly, the memory interface circuit 230*b* may acquire the command CMD or the address ADDR on the basis of the toggle timings of the write enable signal nWE.

The memory interface circuit 230*b* may receive the read enable signal nRE from the UFS device controller 210 through a fifth pin P15. The memory interface circuit 230*b* may receive a data strobe signal DQS from the UFS device controller 210 through a sixth pin P16 or may transmit the data strobe signal DQS to the UFS device controller 210.

In a data DATA output operation of the storage device 224, the memory interface circuit 230*b* may receive the toggling read enable signal nRE through the fifth pin P15 before output of the data DATA. The memory interface circuit 230*b* may generate the toggling data strobe signal DQS on the basis of toggling of the read enable signal nRE. For example, the memory interface circuit 230*b* may generate the data strobe signal DQS that starts to toggle after a predetermined delay (e.g., tDQSRE) on the basis of a toggling start time of the read enable signal nRE. The memory interface circuit 230*b* may transmit the data signal DQ including the data DATA on the basis of the toggle timing of the data strobe signal DQS. Accordingly, the data DATA may be arranged at the toggle timing of the data strobe signal DQS and transmitted to the UFS device controller 210.

In a data DATA input operation of the storage device 224, when the data signal DQ including the data DATA is received from the UFS device controller 210, the memory interface circuit 230*b* may receive the toggling data strobe signal DQS together with the data DATA from the UFS device controller 210. The memory interface circuit 230*b* may acquire the data DATA from the data signal DQ on the basis of the toggle timing of the data strobe signal DQS. For example, the memory interface circuit 230*b* may acquire the data DATA by sampling the data signal DQ at a rising edge and a falling edge of the data strobe signal DQS.

The memory interface circuit 230*b* may transmit a ready/busy output signal nR/B to the UFS device controller 210 through an eighth pin P18. The memory interface circuit 230*b* may transmit the status information of the storage device 224 to the UFS device controller 210 through the ready/busy output signal nR/B. When the storage device 224 is in a busy status (that is, when the internal operations of the storage device 224 are being performed), the memory interface circuit 230b may transmit the ready/busy output signal nR/B indicating the busy status to the UFS device controller 210. When the storage device 224 is in a ready status (i.e., the internal operations of the storage device 224 are not performed or are completed), the memory interface circuit 230b may transmit the ready/busy output signal nR/B indicating the ready status to the UFS device controller 210. For example, while the storage device 224 reads the data DATA from the memory cell array 520 in response to a page read command, the memory interface circuit 230b may transmit the ready/busy output signal nR/B indicating the busy status (e.g., a low level) to the UFS device controller 210. For example, while the storage device 224 programs the data DATA to the memory cell array 520 in response to the program command, the memory interface circuit 230b may transmit the ready/busy output signal nR/B indicating the busy status to the UFS device controller 210.

The control logic circuit 510 may generally control various operations of the storage device 224. The control logic circuit 510 may receive the command/address CMD/ADDR acquired from the memory interface circuit 230b. The control logic circuit 510 may generate control signals for controlling other components of the storage device 224 in accordance with the received command/address CMD/ADDR. For example, the control logic circuit 510 may generate various control signals for programing the data DATA in the memory cell array 520 or reading the data DATA from the memory cell array 520.

The memory cell array 520 may store the data DATA acquired from the memory interface circuit 230b under the control of the control logic circuit 510. The memory cell array 520 may output the stored data DATA to the memory interface circuit 230b under the control of the control logic circuit 510.

The memory cell array 520 may include a plurality of memory cells. For example, the plurality of memory cells may be flash memory cells. However, the present disclosure is not limited thereto, and the memory cells may be RRAM (Resistive Random Access Memory) cells, FRAM (Ferroelectric Random Access Memory) cells, PRAM (Phase Change Random Access Memory) cells, TRAM (Thyristor Random Access Memory) cells, and MRAM (Magnetic Random Access Memory) cells. Hereinafter, embodiments of the present disclosure will be described mainly on the basis of an embodiment in which the memory cells are NAND flash memory cells.

The UFS device controller 210 may include first to eighth pins P21 to P28, and a controller interface circuit 230a. The first to eighth pins P21 to P28 may correspond to the first to eighth pins P11 to P18 of the storage device 224.

The controller interface circuit 230a may transmit the chip enable signal nCE to the storage device 224 through a first pin P21. The controller interface circuit 230a may transmit and receive signals to and from the storage device 224 selected through the chip enable signal nCE, through the second to eighth pins P22 to P28.

The controller interface circuit 230a may transmit the command latch enable signal CLE, the address latch enable signal ALE, and the write enable signal nWE to the storage device 224 through the second to fourth pins P22 to P24. The controller interface circuit 230a may transmit the data signal DQ to the storage device 224 or receive the data signal DQ from the storage device 224 through a seventh pin P27.

The controller interface circuit 230a may transmit the data signal DQ including the command CMD or the address ADDR to the storage device 224 along with the toggling write enable signal nWE. The controller interface circuit 230a may transmit the data signal DQ including the command CMD to the storage device 224 with transmission of the command latch enable signal CLE having the enable status and may transmit the data signal DQ including the address ADDR to the storage device 224 with transmission of the address latch enable signal ALE having the enable status.

The controller interface circuit 230a may transmit the read enable signal nRE to the storage device 224 through a fifth pin P25. The controller interface circuit 230a may receive the data strobe signal DQS from the storage device 224 through a sixth pin P26 or may transmit the data strobe signal DQS to the storage device 224.

In the data DATA output operation of the storage device 224, the controller interface circuit 230a may generate a toggling read enable signal nRE and may transmit the read enable signal nRE to the storage device 224. For example, the controller interface circuit 230a may generate the read enable signal nRE that changes from the static status (e.g., a high level or a low level) to the toggle status before the data DATA is output. Accordingly, the toggling data strobe signal DQS may be generated in the storage device 224 on the basis of the read enable signal nRE. The controller interface circuit 230a may receive the data signal DQ including the data DATA along with the toggling data strobe signal DQS from the storage device 224. The controller interface circuit 230a may acquire the data DATA from the data signal DQ on the basis of the toggle timing of the data strobe signal DQS.

In the data DATA input operation of the storage device 224, the controller interface circuit 230a may generate the toggling data strobe signal DQS. For example, the controller interface circuit 230a may generate the data strobe signal DQS that changes from the static status (e.g., a high level or a low level) to the toggle status before transmitting the data DATA. The controller interface circuit 230a may transmit the data signal DQ including the data DATA to the storage device 224 on the basis of the toggle timings of the data strobe signal DQS.

The controller interface circuit 230a may receive the ready/busy output signal nR/B from the storage device 224 through an eighth pin P28. The controller interface circuit 230a may discriminate the status information of the storage device 224 on the basis of the ready/busy output signal nR/B.

Figure 5:
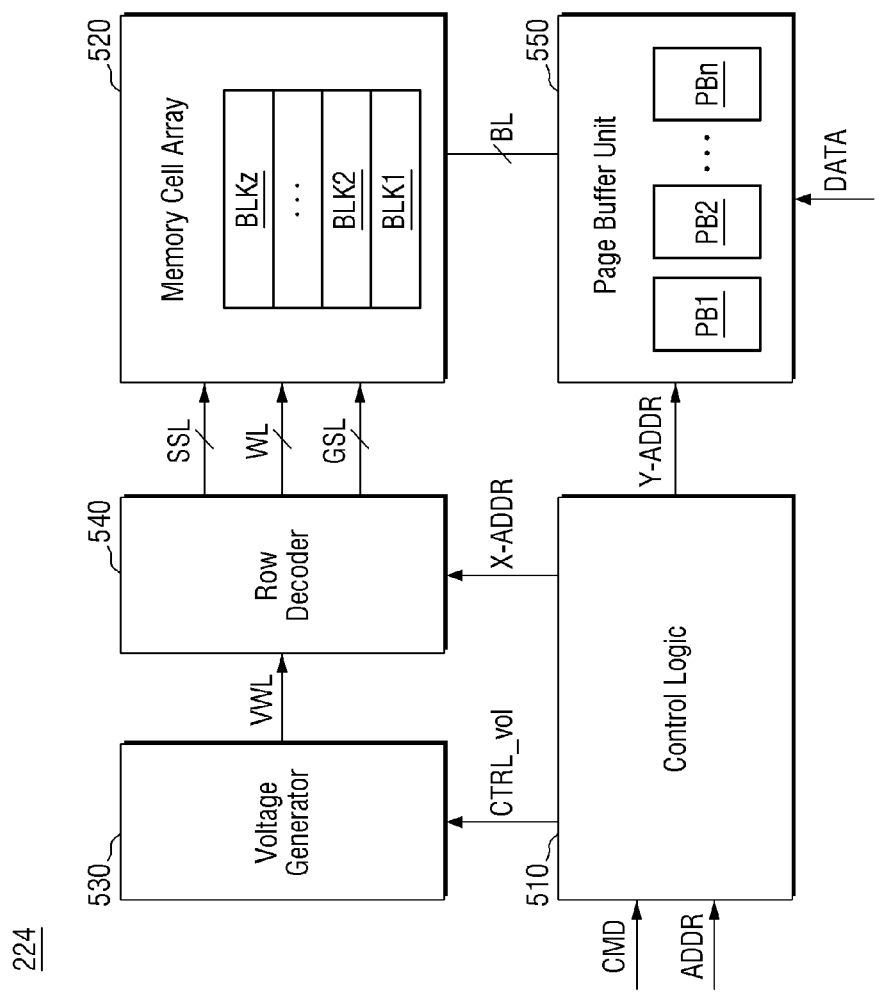
FIG. 5 is an exemplary block diagram showing the storage device of FIG. 4.

FIG. 5 is an exemplary block diagram showing the storage device of FIG. 4.

Referring to FIG. 5, the storage device 224 may include a control logic circuit 510, a memory cell array 520, a page buffer unit 550, a voltage generator 530, and a row decoder 540. Although not shown in FIG. 5, the storage device 224 may further include the memory interface circuit 230b shown in FIG. 4 and may further include a column logic, a pre-decoder, a temperature sensor, a command decoder, an address decoder, and the like.

The control logic circuit 510 may generally control various operations inside the storage device 224. The control logic circuit 510 may output various control signals in response to the command CMD and/or the address ADDR from the memory interface circuit 230b. For example, the control logic circuit 510 may output a voltage control signal CTRL_vol, a row address X-ADDR, and a column address Y-ADDR.

The memory cell array 520 may include a plurality of memory blocks BLK1 to BLKz (z is a positive integer) and each of the plurality of memory blocks BLK1 to BLKz may include a plurality of memory cells. The memory cell array 520 may be connected to the page buffer unit 550 through the bit lines BL and may be connected to the row decoder 540 through word lines WL, string selection lines SSL, and ground selection lines GSL.

In an exemplary embodiment, the memory cell array 520 may include a three-dimensional memory cell array and the three-dimensional memory cell array may include a plurality of NAND strings. Each NAND string may include memory cells which are each connected to word lines stacked vertically on the substrate. U.S. Pat. Nos. 7,679,133, 8,553,466, 8,654,587, 8,559,235, and U.S. Patent Application Publication No. 2011/0233648 are incorporated herein by reference. In an exemplary embodiment, the memory cell array 520 may include a two-dimensional memory cell array and the two-dimensional memory cell array may include a plurality of NAND strings placed along row and column directions.

The page buffer unit 550 may include a plurality of page buffers PB1 to PBn (n is an integer of three or more), and each of the plurality of page buffers PB1 to PBn may be connected to the memory cells through a plurality of bit lines BL. The page buffer unit 550 may select at least one bit line among the bit lines BL in response to the column address Y-ADDR. The page buffer unit 550 may operate as a write driver or a detection amplifier, depending on the operating mode. For example, at the time of a program operation, the page buffer unit 550 may apply a bit line voltage corresponding to the data to be programmed to the selected bit line. At the time of a read operation, the page buffer unit 550 may detect the current or voltage of the selected bit line and detect the data stored in the memory cell.

The voltage generator 530 may generate various types of voltages for performing program, read, and erasure operations on the basis of the voltage control signal CTRL_vol. For example, the voltage generator 530 may generate a program voltage, a read voltage, a program verification voltage, an erasure voltage, and the like, as a word line voltage VWL.

The row decoder 540 may select one of a plurality of word lines WL and may select one of a plurality of string selection lines SSL in response to the row address X-ADDR. For example, the row decoder 540 may apply the program voltage and the program verification voltage to the selected word line at the time of the program operation and may apply the read voltage to the selected word line at the time of the read operation.

Figure 6:
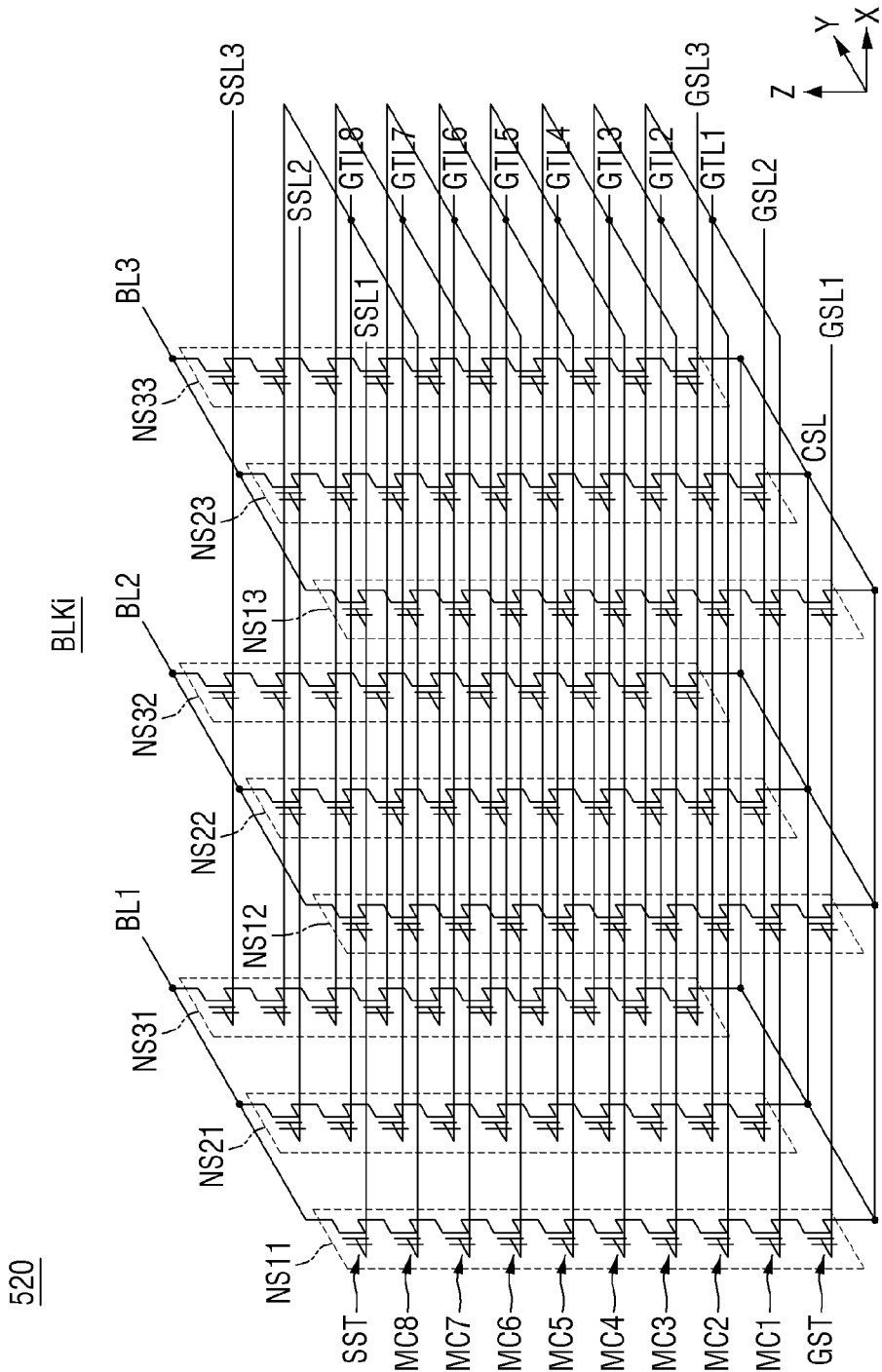
FIG. 6 is a diagram for explaining a 3D V-NAND structure according to some embodiments.

FIG. 6 is a diagram for explaining a 3D V-NAND structure according to some embodiments.

When the storage module of the storage device is implemented as a 3D V-NAND type flash memory, each of the plurality of memory blocks constituting the storage module may be expressed by an equivalent circuit as shown in FIG. 6.

A memory block BLKi shown in FIG. 6 shows a three-dimensional memory block formed in a three-dimensional structure on the substrate. For example, a plurality of memory NAND strings included in the memory block BLKi may be formed in a direction perpendicular to the substrate.

Referring to FIG. 6, the memory block BLKi may include a plurality of memory NAND strings NS11 to NS33 connected between the bit lines BL1, BL2, and BL3 and the common source line CSL. Each of the plurality of memory NAND strings NS11 to NS33 may include a string selection transistor SST, a plurality of memory cells MC1, MC2, . . . , MC8, and a ground selection transistor GST. Although FIG. 6 shows that each of the plurality of memory NAND strings NS11 to NS33 includes eight memory cells MC1, MC2, . . . , MC8, the embodiment is not necessarily limited thereto.

The string selection transistor SST may be connected to the corresponding string selection lines SSL1, SSL2, and SSL3. Each of the plurality of memory cells MC1, MC2, . . . , MC8 may be connected to the corresponding gate lines GTL1, GTL2, . . . , and GTL8. The gate lines GTL1, GTL2, GTL8 may correspond to word lines, and some of the gate lines GTL1, GTL2, GTL8 may correspond to dummy word lines. The ground selection transistor GST may be connected to the corresponding ground selection lines GSL1, GSL2, and GSL3. The string selection transistor SST may be connected to the corresponding bit lines BL1, BL2, and BL3, and the ground selection transistor GST may be connected to the common source line CSL.

The word lines (e.g., WL1) of the same height are connected in common, and the ground selection lines GSL1, GSL2, and GSL3 and the string selection lines SSL1, SSL2, and SSL3 may be separated, respectively. Although FIG. 6 shows that the memory block BLK is connected to eight gate lines GTL1, GTL2, . . . , and GTL8 and three bit lines BL1, BL2, and BL3, the embodiment is not necessarily limited thereto.

Referring to FIG. 2 again, the host device 100 may include a DRAM host controller 160. The DRAM host controller 160 may provide a signal to the second memory device 300 through the DRAM interface DIF and the repeater module 400. That is, the second memory device 300 may be controlled by the DRAM host controller 160.

The DRAM interface DIF may send the command CMD, the address ADDR, the data signal DQ, the data strobe signal DQS, and the like. Here, that is, the DRAM interface DIF may provide the command CMD and the address ADDR from the host device 100 to the second memory device 300 and may transmit and receive the data signal DQ and the data strobe signal DQS between the host device 100 and the second memory device 300. The second memory device 300 may write or read the data signal DQ on the basis of the data strobe signal DQS.

The repeater module 400 may electrically connect the host device 100 and the second memory device 300. That is, the second memory device 300 is not directly connected to the host device 100 but may be connected through the repeater module 400.

The repeater module 400 may receive the command CMD, the address ADDR, the data signal DQ, the data strobe signal DQS, and the like from the host device 100 and may receive the recovery clock signal REC_CLK from the first memory device 200. Here, the recovery clock signal REC_CLK may be generated from the UIC layer 250 of the first memory device 200. The repeater module 400 may improve the quality of the signal received from the host device 100, by utilizing the recovery clock signal REC_CLK received from the first memory device 200. That is, the quality of the signal to be sent to the second memory device 300 separated from the host device 100 may be degraded. Therefore, the repeater module 400 may receive the recovery clock signal REC_CLK from the adjacent first memory device 200 and may provide an improved signal to the second memory device 300, using the received recovery clock signal REC_CLK. Accordingly, the quality of the signal to be sent to the second memory device 300 may be improved.

Figure 7:
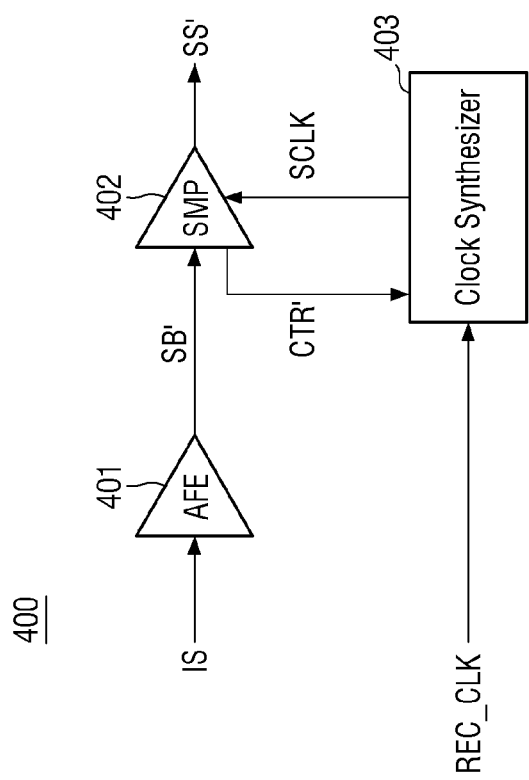
FIG. 7 is a block diagram for explaining a repeater module according to some embodiments.

FIG. 7 is a block diagram for explaining a repeater module according to some embodiments.

Referring to FIG. 7, the repeater module 400 may include an equalizer 401, a sampler 402, and a clock synthesizer 403.

The equalizer 401 may receive an input signal IS from the host device 100, perform equalizing, and output a serial bit SB'. Here, the input signal IS may include the command CMD, the address ADDR, the data signal DQ and the data strobe signal DQS provided from the host device 100. However, the embodiments of the present disclosure are not limited thereto, the input signal IS includes the data signal DQ and the data strobe signal DQS and may not include the command CMD and the address ADDR. That is, the command CMD and the address ADDR may be sent directly to the second memory device 300 without passing through the repeater module 400. Further, the input signal IS may be a differential input signal pair, but the embodiment of the present disclosure is not limited thereto. The serial bit SB' may be provided to the sampler 402.

The clock synthesizer 403 may receive the recovery clock signal REC_CLK from the first memory device 200. The clock synthesizer 403 may generate a synthesized clock signal SCLK by transforming the recovery clock signal REC_CLK. That is, the clock synthesizer 403 may generate the synthesized clock signal SCLK on the basis of the recovery clock signal REC_CLK by controlling the control signal CTR' from the sampler 402. Although information on the synthesized clock signal SCLK may differ from information on the recovery clock signal REC_CLK, both may be the same. For example, a frequency of the synthesized clock signal SCLK may differ from a frequency of the recovery clock signal REC_CLK.

The sampler 402 may receive the serial bit SB' from the equalizer 401 and may receive the synthesized clock signal SCLK from the clock synthesizer 403. The sampler 402 may generate a sampling signal SS' by sampling the serial bits SB' on the basis of the synthesized clock signal SCKL.

The recovery clock signal REC_CLK is not sent from the host device 100 separated from the second memory device 300 but is sent from the first memory device 200 adjacent to the second memory device 300, and thus, the signal quality of the recovery clock signal REC_CLK may not degraded. Therefore, the quality of the sampling signal SS' sampled on the basis of the recovery clock signal REC_CLK may be improved.

Here, when the second memory device 300 is an LPDDR4 DRAM, the input signal IS may include the data signal DQ and the data strobe signal DQS. The use of the recovery clock signal REC_CLK in the repeater module 400 may improve the quality of the data signal DQ and the data strobe signal DQS and improve quality of the write operation of the second memory device 300.

Further, when the second memory device 300 is an LPDDR5 DRAM, the input signal IS may include a read data signal and a read data strobe signal. The use of the recovery clock signal REC_CLK in the repeater module 400 may improve the quality of the read data signal and the read data strobe signal and improve the quality of the write operation of the second memory device 300.

Figure 8:
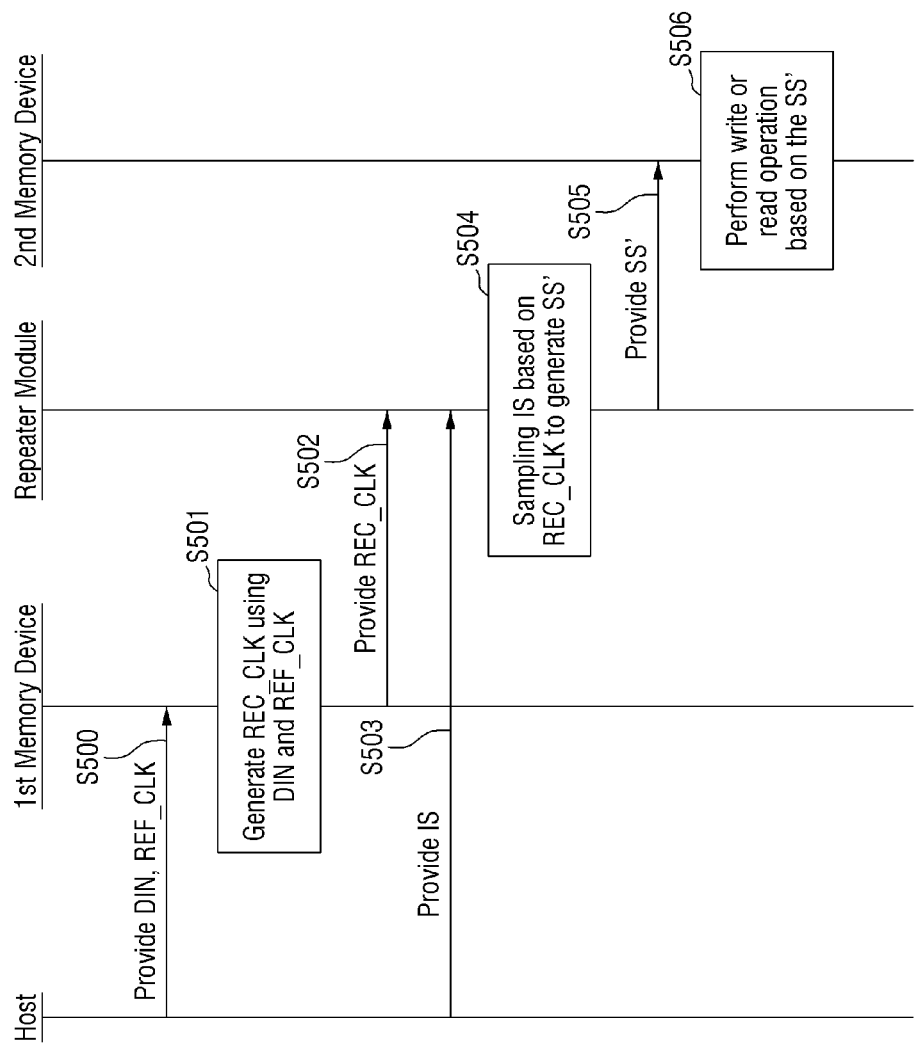
FIG. 8 is a ladder diagram for explaining a signal transmission of the configuration of the semiconductor chip.

FIG. 8 is a ladder diagram for explaining a signal transmission of the configuration of the semiconductor chip.

Referring to FIGS. 2, 3, 7, and 8, the host device 100 may provide an input signal DIN and a reference clock signal REF_CLK to the first memory device 200 (S500). Here, the input signal DIN may include differential input signal pairs DIN_T and DIN_C. The first memory device 200 may generate the recovery clock signal REC_CLK, using the input signal DIN and the reference clock signal REF_CLK (S501). That is, the UIC layer 250 of the first memory device 200 may generate the recovery clock signal REC_CLK on the basis of the serial bit SB generated based on the input signal DIN and the reference clock signal REF_CLK. The first memory device 200 may provide the recovery clock signal REC_CLK to the repeater module 400 (S502). The host device 100 may also provide the input signal IS to the repeater module 400 (S503).

The repeater module 400 may generate a sampling signal SS' by sampling the input signal IS based on the recovery clock signal REC_CLK (S504). The repeater module 400 may provide the generated sampling signal SS' to the second memory device 300 (S505). In addition, the second memory device 300 may perform a write or read operation on the basis of the sampling signal SS' (S504). Here, the signal from the semiconductor chip 1 may be sent in one direction from the host device 100 to the second memory device 300. That is, the signal sent from the second memory device 300 to the host device 100 may not pass through the repeater module 400. However, the embodiments of the present disclosure are not limited thereto.

Referring to FIG. 2 again, the second memory device 300 may include a volatile storage 300a and a DRAM device controller 300c. The sampling signal SS' from the repeater module 400 may be provided to the DRAM device controller 300c. The DRAM device controller 300c may control the overall operation of the second memory device 300. For example, the DRAM device controller 300c may write or read data to or from the volatile storage 300a on the basis of the received signal. Hereinafter, the volatile storage 300a will be described in more detail referring to FIG. 9.

Figure 9:
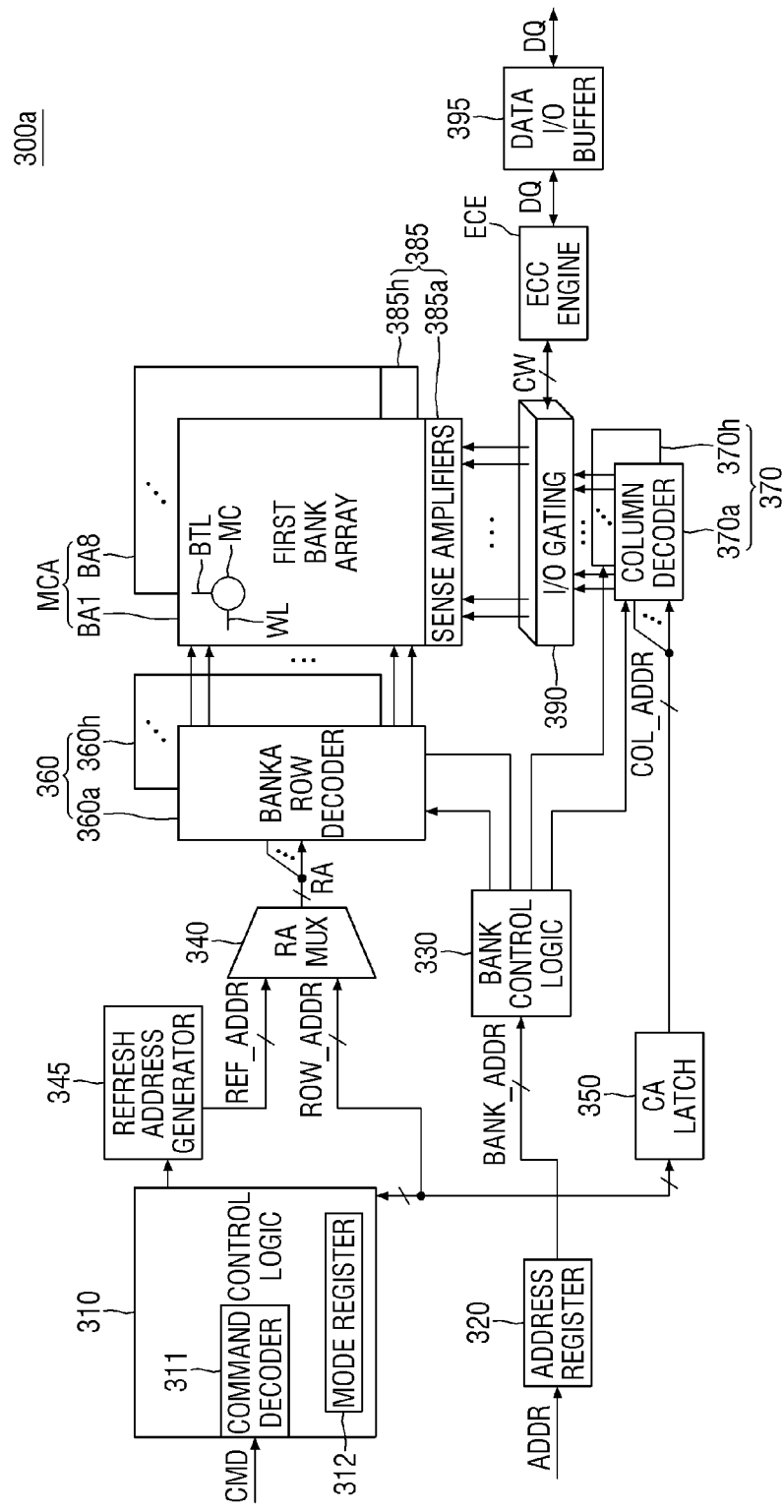
FIG. 9 is a block diagram for explaining a first memory device according to some embodiments.

FIG. 9 is a block diagram for explaining a first memory device according to some embodiments.

Referring to FIG. 9, the volatile storage 300a includes a control logic 310, an address register 320, a bank control logic 330, a row address multiplexer 340, a refresh address generator 345, a column address latch 350, a row decoder 360, a column decoder 370, a sense amplifier 385, an input/output gating circuit 390, a memory cell array MCA, an ECC engine ECE, and a data input/output buffer 395.

The memory cell array MCA may include a plurality of memory cells MC for storing data. Specifically, the memory cell array MCA may include first to eighth bank arrays BA1 to BA8. Each of the first to eighth bank arrays BA1 to BA8 may include a plurality of word lines WL and a plurality of bit lines BTL, and a plurality of memory cells MC formed at the intersection between the word lines WL and the bit lines BTL.

The plurality of memory cells MC may include first to eighth bank arrays BA1 to BA8. FIG. 9 shows a volatile storage 300a including eight bank arrays BA1 to BA8, but is not limited thereto, and the volatile storage 300a may include any number of bank arrays.

The control logic 310 may control the operation of the volatile storage 300a. For example, the control logic 310 may generate control signals such that the volatile storage 300a performs an operation of wiring the data or an operation of reading the data. The control logic 310 may include a command decoder 311 that decodes the command CMD received from the host device 100 and a mode register 312 for setting the operating mode of the volatile storage 300a.

For example, the command decoder 311 may decode a write enable signal /WE, a row address strobe signal /RAS, a column address strobe signal /CAS, a chip selection signal /CS and the like to generate the control signals corresponding to the command CMD. The control logic 310 may also receive a clock signal CLK and a clock enable signal for driving the volatile storage 300a in a synchronous manner.

Further, the control logic 310 may control the refresh address generator 345 to generate a refresh row address REF_ADDR in response to a refresh command.

The address register 320 may receive the address ADDR from the host device 100. For example, the address register 320 may receive an address ADDR including a bank address BANK_ADDR, a row address ROW_ADDR, and a column address COL_ADDR. The address register 320 may provide the received bank address BANK_ADDR to the bank control logic 330, may provide the received row address ROW_ADDR to the row address multiplexer 340, and may provide the received column address COL_ADDR to the column address latch 350.

The bank control logic 330 may generate bank control signals in response to the bank address BANK_ADDR received from the address register 320. In response to these bank control signals, the bank row decoder corresponding to the bank address BANK_ADDR among the first to eighth bank row decoders 360a to 360h may be activated and the bank column decoder corresponding to the bank address BANK_ADDR among the first to eighth bank column decoders 370a to 370h may be activated.

The row address multiplexer 340 may receive the row address ROW_ADDR from the address register 320 and may receive the refresh row address REF_ADDR from the refresh address generator 345. The row address multiplexer 340 may selectively output the row address ROW_ADDR received from the address register 320 or the refresh row address REF_ADDR received from the refresh address generator 345 as the row address RA. The row address RA that is output from the row address multiplexer 340 may be applied to each of the first to eighth bank row decoders 360a to 360h.

The refresh address generator 345 may generate the refresh row address REF_ADDR for refreshing the memory cells. The refresh address generator 345 may provide the refresh row address REF_ADDR to the row address multiplexer 340. Accordingly, the memory cells placed in the word line corresponding to the refresh row address REF_ADDR may be refreshed.

The column address latch 350 may receive the column address COL_ADDR from the address register 320 and temporarily store the received column address COL_ADDR. Further, the column address latch 350 may gradually increase the received column address COL_ADDR in a burst mode. The column address latch 350 may apply a temporarily stored or gradually increased column address COL_ADDR to each of the first to eighth bank column decoders 370a to 370h.

The row decoder 360 may include first to eighth bank row decoders 360a to 360h connected to each of the first to eighth bank arrays BA1 to BA8. The column decoder 370 may include first to eighth bank column decoders 370a to 370h connected to each of the first to eighth bank arrays BA1 to BA8. The sense amplifier 385 may include first to eighth bank sense amplifiers 385a to 385h connected to each of the first to eighth bank arrays BA1 to BA8.

A bank row decoder activated by the bank control logic 330 among the first to eighth bank row decoders 360a to 360h may decode the row address RA that is output from the row address multiplexer 340 to activate the word line corresponding to the row address RA. For example, the activated bank row decoder described above may apply a word line drive voltage to the word line corresponding to the row address RA.

The bank column decoder activated by the bank control logic 330 among the first to eighth bank column decoders 370a to 370h may activate the bank sense amplifiers 385a to 385h corresponding to the bank address BANK_ADDR and the column address COL_ADDR through the input/output gating circuit 390.

The input/output gating circuit 390 may include input data mask logic, read data latches for storing the data output from the first to eighth bank arrays BA1 to BA8, and write drivers for writing data to the first to eighth bank arrays BA1 to BA8, together with circuits for gating the input and output data.

A code word CW to be read from one of the first to eighth bank arrays BA1 to BA8 is detected by the bank sense amplifier 385a to 385h corresponding to the one bank array and may be stored in the read data latches. The ECC engine ECE may perform ECC decoding on the code word CW stored in the read data latches. When an error is detected in the code word CW data, the ECC engine ECE may provide the corrected data signal DQ to the memory controller 10 through the data input/output buffer 395.

The data signal DQ to be written to one bank array among the first to eighth bank arrays BA1 to BA8 is provided to the ECC engine ECE, the ECC engine ECE generates parity bits on the basis of the data signal DQ, and provides the data signal DQ and the parity bits to the input/output gating circuit 390. The input/output gating circuit 390 may write the data signal DQ and the parity bits to a subpage of the one bank array through the write drivers.

The data input/output buffer 395 may provide the data signal DQ to the ECC engine ECE in the write operation and may provide the data signal DQ provided from the ECC engine ECE to the host device 100 in the read operation.

Hereinafter, a semiconductor chip 1' according to another embodiment will be described referring to FIGS. 10 to 12.

Figure 10:
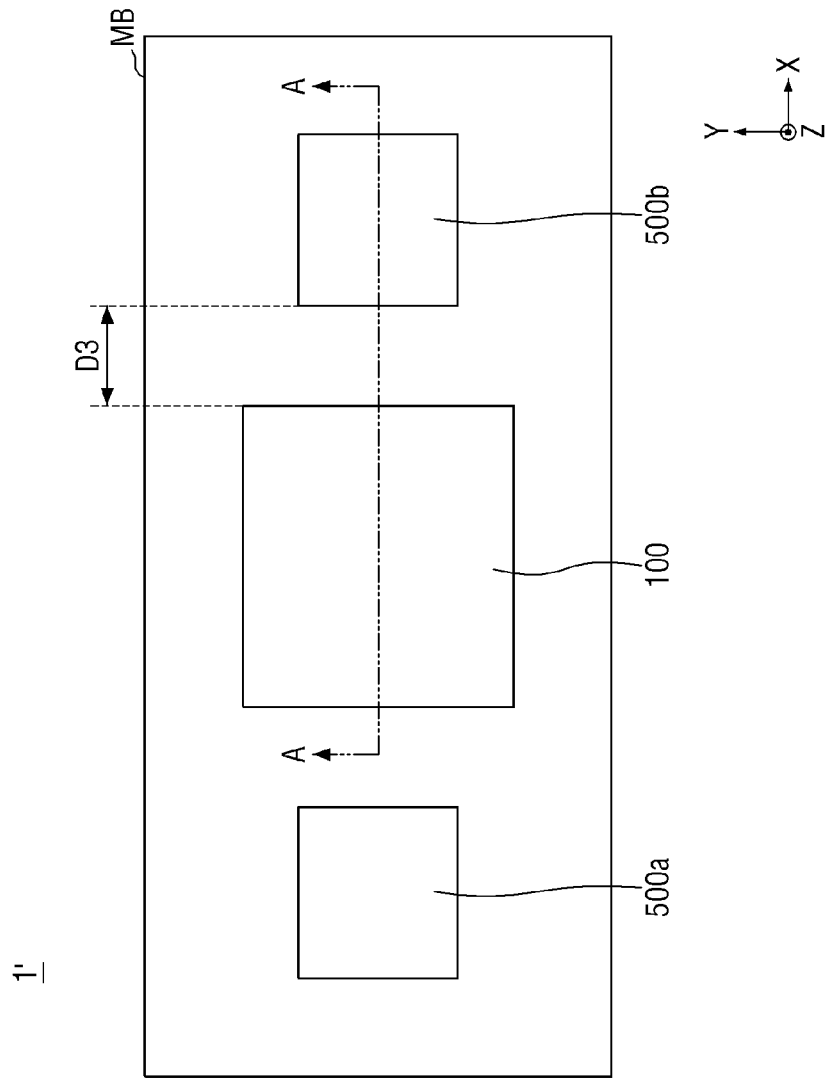
FIG. 10 is a top view of the semiconductor chip according to some embodiments.

FIG. 10 is a top view of the semiconductor chip according to some embodiments. FIG. 11 is a cross-sectional view of the semiconductor chip of FIG. 10 taken along A-A. FIG. 12 is a block diagram for explaining the semiconductor chip of FIG. 10. For convenience of explanation, repeated parts of contents explained referring to FIGS. 1 to 9 will be briefly explained or omitted.

Figure 11:
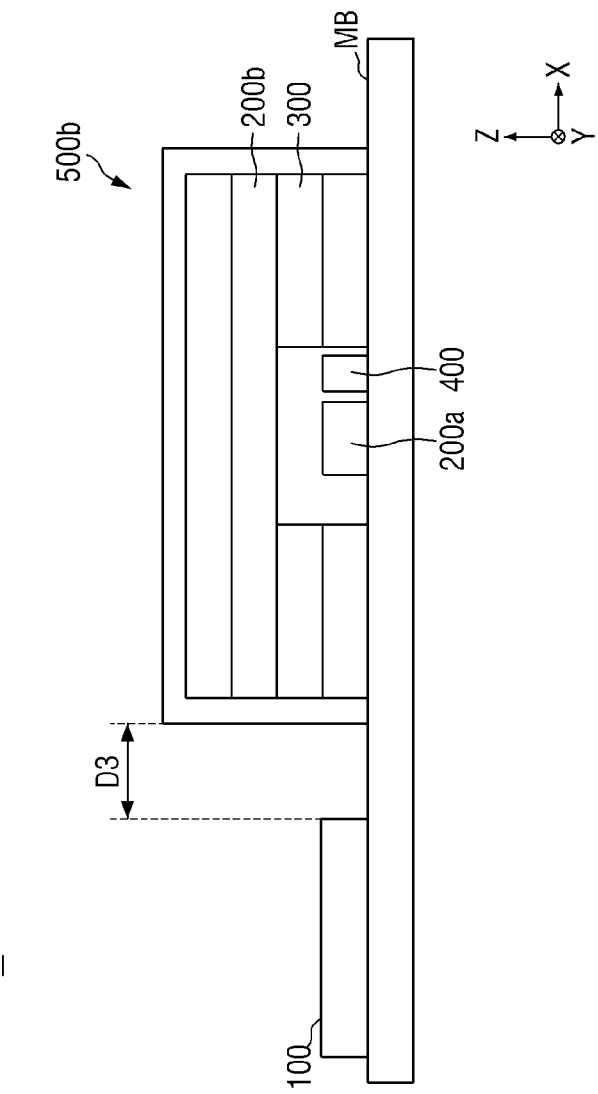
FIG. 11 is a cross-sectional view of the semiconductor chip of FIG. 10 taken along A-A.

Referring to FIGS. 10 and 11, the semiconductor chip 1' may include UFS multi-chip packages 500a and 500b and a host device 100 placed in a row on the motherboard MB. The UFS multi-chip packages 500a and 500b may be electrically connected to the host device 100 through the motherboard MB. Further, although the UFS multi-chip packages 500a and 500b may be placed symmetrically with the host device 100 interposed therebetween, the embodiments of the present disclosure are not limited thereto. That is, the host device 100 may be placed between the UFS multi-chip packages 500a and 500b.

The host device 100 and the UFS multi-chip package 500b may be spaced apart from each other in the first direction X by a third distance D3. That is, the host device 100 and the UFS multi-chip package 500b may not be in direct contact with each other.

The UFS multi-chip package 500b may include a UFS controller 200a, a non-volatile memory device 200b, a second memory device 300 and a repeater module 400. Here, the UFS controller 200a and the non-volatile memory may correspond to the first memory device 200 described referring to FIGS. 1 to 9. That is, the UFS device controller 210 and the UIC layer 250 of the first memory device 200 may correspond to the UFS controller 200a, and the non-volatile storage 220 of the first memory device 200 may correspond to the non-volatile memory device 200b.

The UFS controller 200a may be placed between the second memory devices 300 placed on both sides, and the repeater module 400 may be placed between the UFS controller 200a and the second memory device 300. Further, the non-volatile memory device 200b may be placed on the second memory device 300. They may be electrically connected to each other. Further, the repeater module 400 may be electrically connected to the UFS controller 200a and may be electrically connected to the second memory device 300. However, the embodiments of the present disclosure are not limited thereto and the shapes of the UFS multi-chip packages 500a and 500b may differ.

Figure 12:
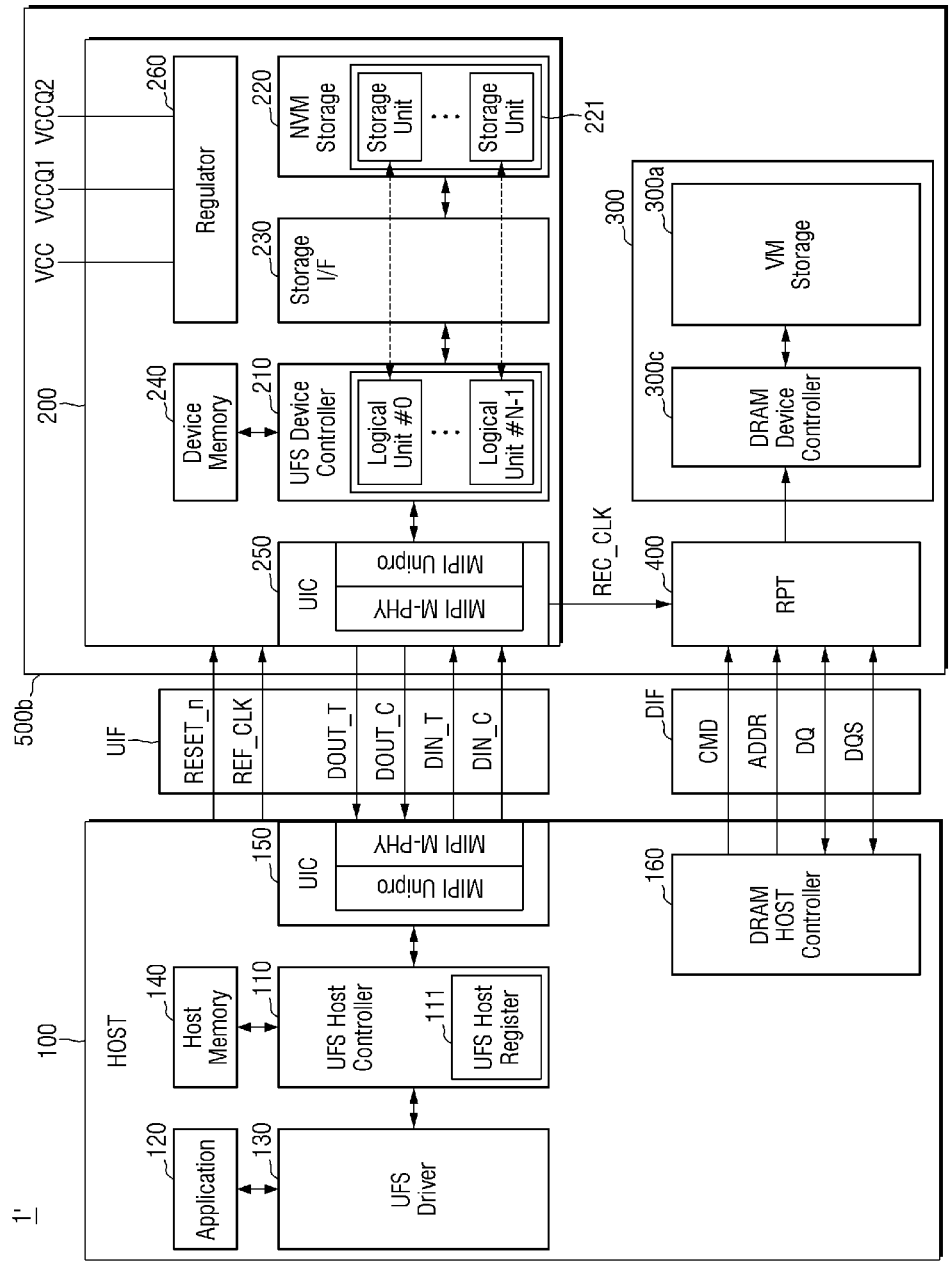
FIG. 12 is a block diagram for explaining the semiconductor chip of FIG. 10.

Referring to FIG. 12, the repeater module 400 included in the UFS multi-chip package 500b may receive the command CMD, the address ADDR, the data signal DQ and the data strobe signal DQ from the host device 100 and may receive the recovery clock signal REC_CLK from the UIC layer 250 of the first memory device 200. As described referring to FIGS. 1 to 9, the second memory device 300 may receive a signal whose quality is improved by utilizing the recovery clock signal REC_CLK from the repeater module 400.

Hereinafter, a semiconductor chip 1" and a semiconductor chip 1'" according to another embodiment will be described referring to FIGS. 13 to 15.

Figure 13:
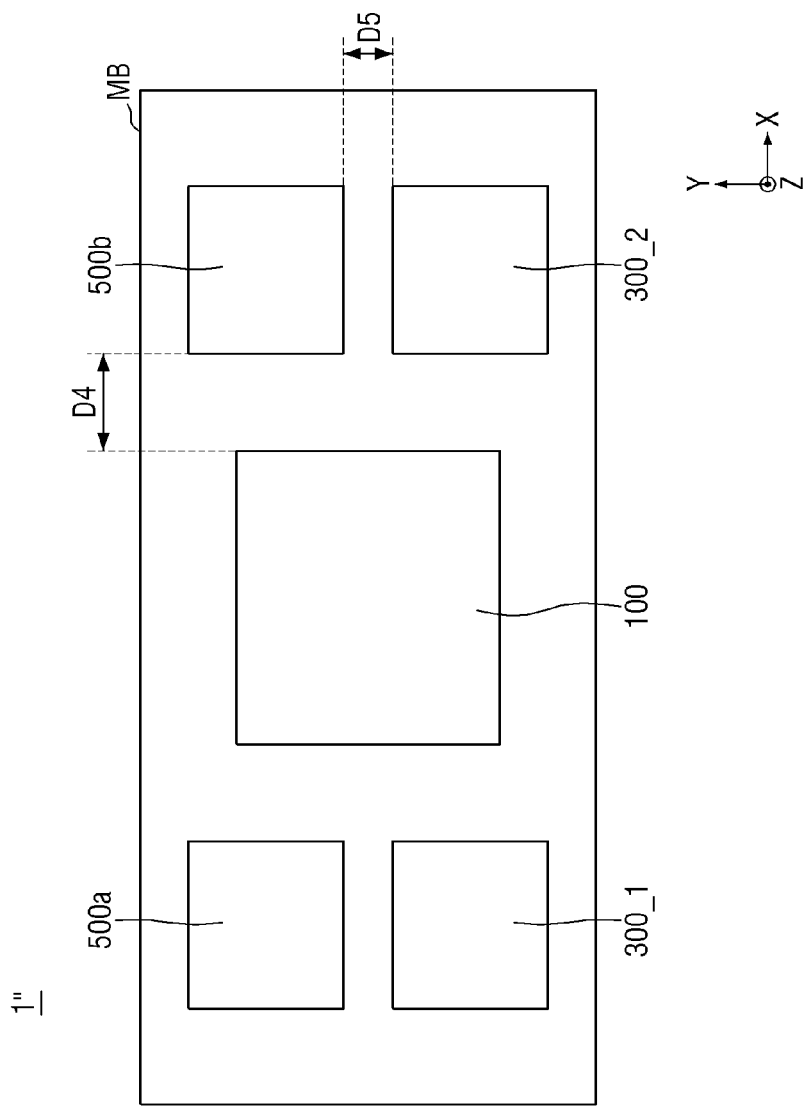
FIG. 13 is a top view of the semiconductor chip according to some embodiments.

FIG. 13 is a top view of the semiconductor chip according to some embodiments. FIG. 14 is a block diagram for explaining the semiconductor chip of FIG. 13. FIG. 15 is a block diagram for explaining the semiconductor chip of FIG. 13. For convenience of explanation, repeated parts of contents explained referring to FIGS. 1 to 12 will be briefly explained or omitted.

Referring to FIG. 13, the semiconductor chip 1" may include a host device 100, UFS multi-chip packages 500a and 500b, and a plurality of second memory devices 300_1 and 300_2. Here, the second memory devices 300_1 and 300_2 may have the same structure as the second memory device 300 described referring to FIGS. 2 and 9. That is, the second memory device 300 may be a volatile memory device, i.e., a DRAM device.

The second memory devices 300_1 and 300_2 may be placed adjacent to the UFS multi-chip packages 500a and 500b. Also, the host device 100 may be placed between the UFS multi-chip packages 500a and 500b and the second memory devices 300_1 and 300_2. Here, a distance between the host device 100 and the UFS multi-chip package 500b may be a fourth distance D4, and a distance between the UFS multi-chip package 500b and the second memory device 300_2 may be a fifth distance D5. Here, the fourth distance D4 may be greater than the fifth distance D5. Further, the host device 100 may be placed so as to be spaced apart from both the UFS multi-chip packages 500a and 500b and the second memory devices 300_1 and 300_2.

Figure 14:
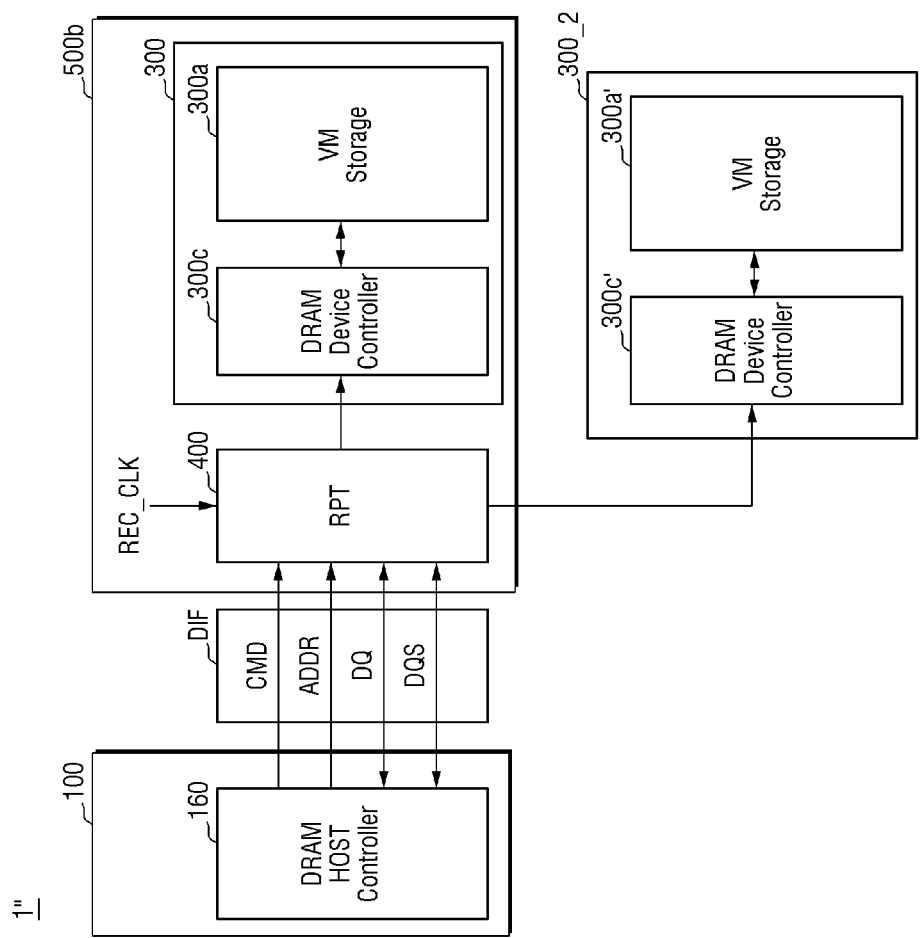
FIG. 14 is a block diagram for explaining the semiconductor chip of FIG. 13.

Referring to FIG. 14, the second memory device 300_2 is separated from and may be electrically connected to the UFS multi-chip package 500b. Here, the second memory device 300_2 may include a volatile storage 300a' and a DRAM device controller 300c'. Here, although a part of the configuration of the host device 100 and the UFS multi-chip package 500b is omitted, this is the same as the configuration of the host device 100 and the UFS multi-chip package 500b described referring to FIG. 12.

The second memory device 300_2 may be connected to the repeater module 400 of the UFS multi-chip package 500b. The second memory device 300_2 may receive the signal from the UFS multi-chip package 500b. Here, the signal sent from the repeater module 400 may be a signal obtained by improving the signal sent from the host device 100 using the recovery clock signal REC_CLK. That is, the second memory device 300_2 may receive the signal whose quality is improved by the recovery clock signal REC_CLK. At this time, since the second memory device 300_2 is implemented without using another repeater module 400, the usage power and the usage area may be reduced.

Figure 15:
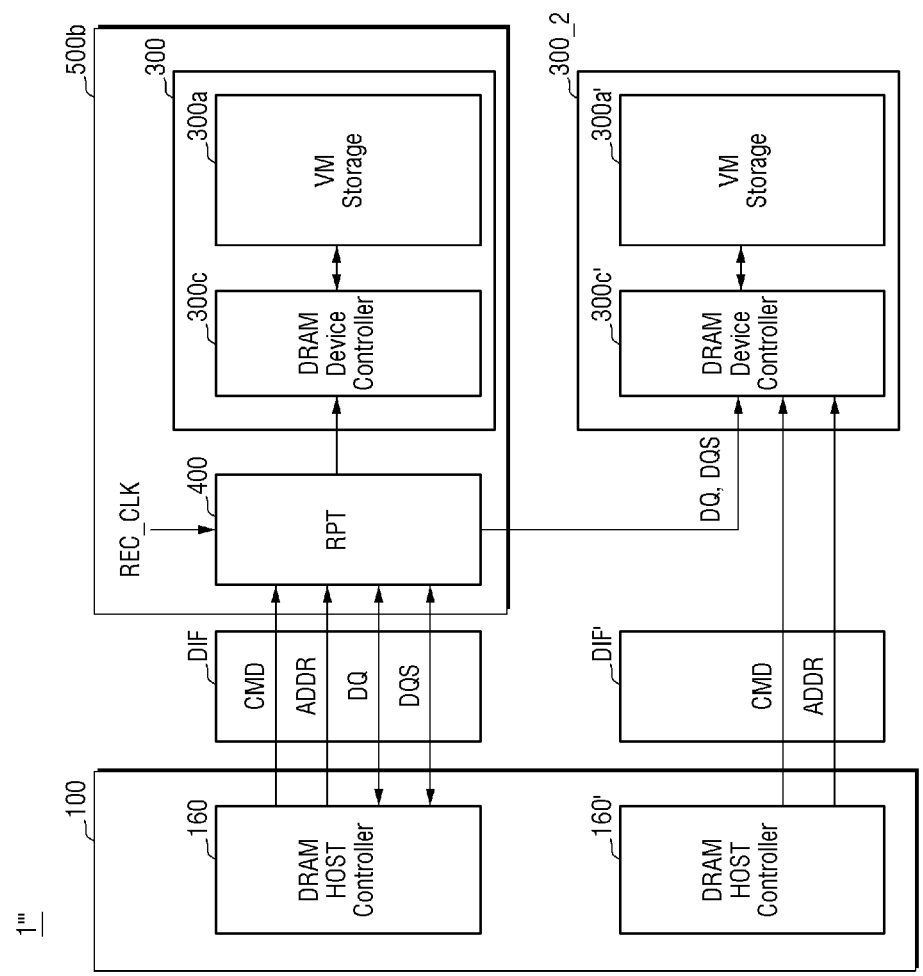
FIG. 15 is a block diagram for explaining the semiconductor chip of FIG. 13.

Referring to FIG. 15, the semiconductor chip 1'" may include a host device 100, a UFS multi-chip package 500b and a second memory device 300_2. Here, the host device 100 may include a DRAM host controller 160'. That is, the second memory device 300_2 may be connected to both the UFS multi-chip package 500b and the host device 100.

The second memory device 300_2 may receive the signal including the data signal DQ and the data strobe signal DQS from the repeater module 400 of the UFS multi-chip package 500b. Here, the data signal DQ and the data strobe signal DQS may be signals whose quality is improved by utilizing the recovery clock signal REC_CLK. The second memory device 300_2 may receive the signal including the command CMD and the address ADDR from the host device 100 through a DRAM interface DIF'. Here, the command CMD and the address ADDR correspond to the signals whose quality is not improved by the recovery clock signal REC_CLK. That is, the second memory device 300_2 may receive and utilize both the signal with improved quality and the signal without improved quality.

Hereinafter, a semiconductor chip 1"" according to another embodiment will be described referring to FIGS. 16 and 17.

Figure 16:
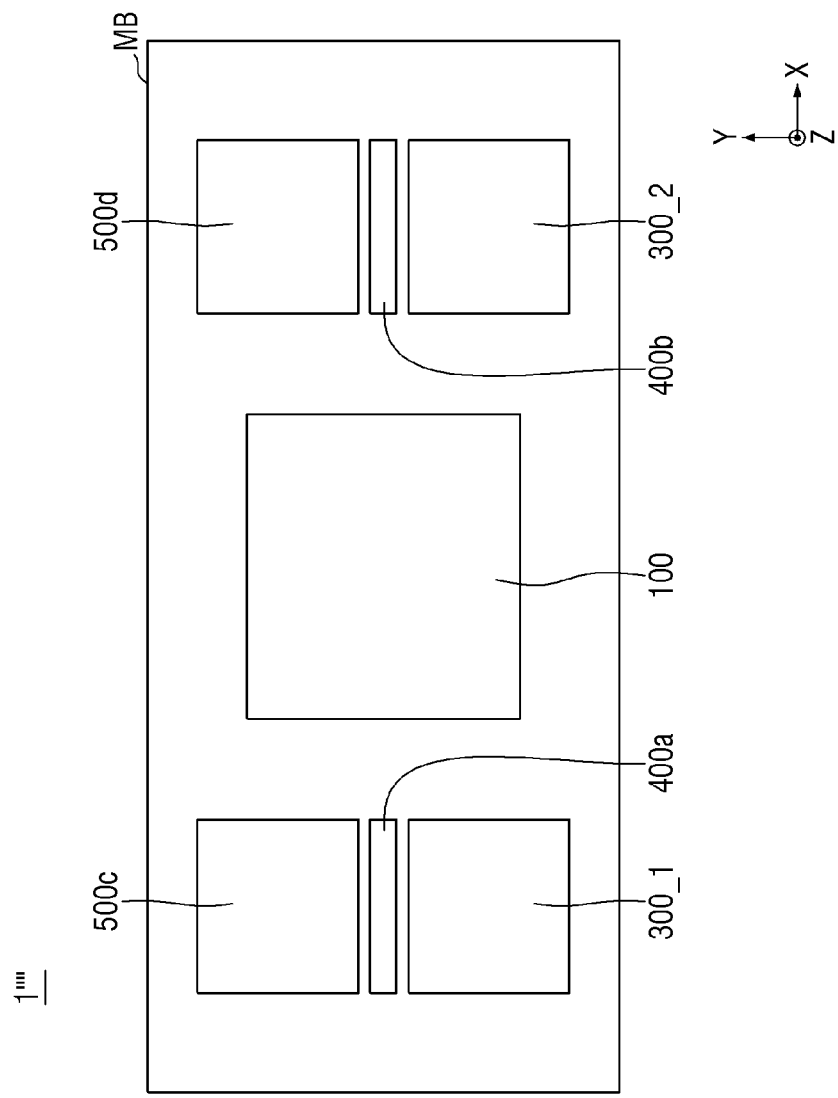
FIG. 16 is a top view of the semiconductor chip according to some embodiments.

FIG. 16 is a top view of the semiconductor chip according to some embodiments. FIG. 17 is a block diagram for explaining the semiconductor chip of FIG. 16. For convenience of explanation, repeated parts of contents explained referring to FIGS. 1 to 15 will be briefly described or omitted.

Referring to FIG. 16, the semiconductor chip 1"" may include a host device 100, UFS multi-chip packages 500c and 500d, second memory devices 300_1 and 300_2, and repeater modules 400a and 400b. Here, the host device 100, the UFS multi-chip packages 500c and 500d, the second memory devices 300_1 and 300_2, and the repeater modules 400a and 400b may all be mounted on the motherboard MB.

The repeater modules 400a and 400b may be placed between the UFS multi-chip packages 500c and 500d and the memory devices 300_1 and 300_2. Here, the repeater modules 400a and 400b do not exist inside the UFS multi-chip packages 500c and 500d, but may be placed separately. That is, the repeater modules 400a and 400b may be placed apart from the host device 100, the UFS multi-chip packages 500c and 500d, and the second memory devices 300_1 and 300_2.

Figure 17:
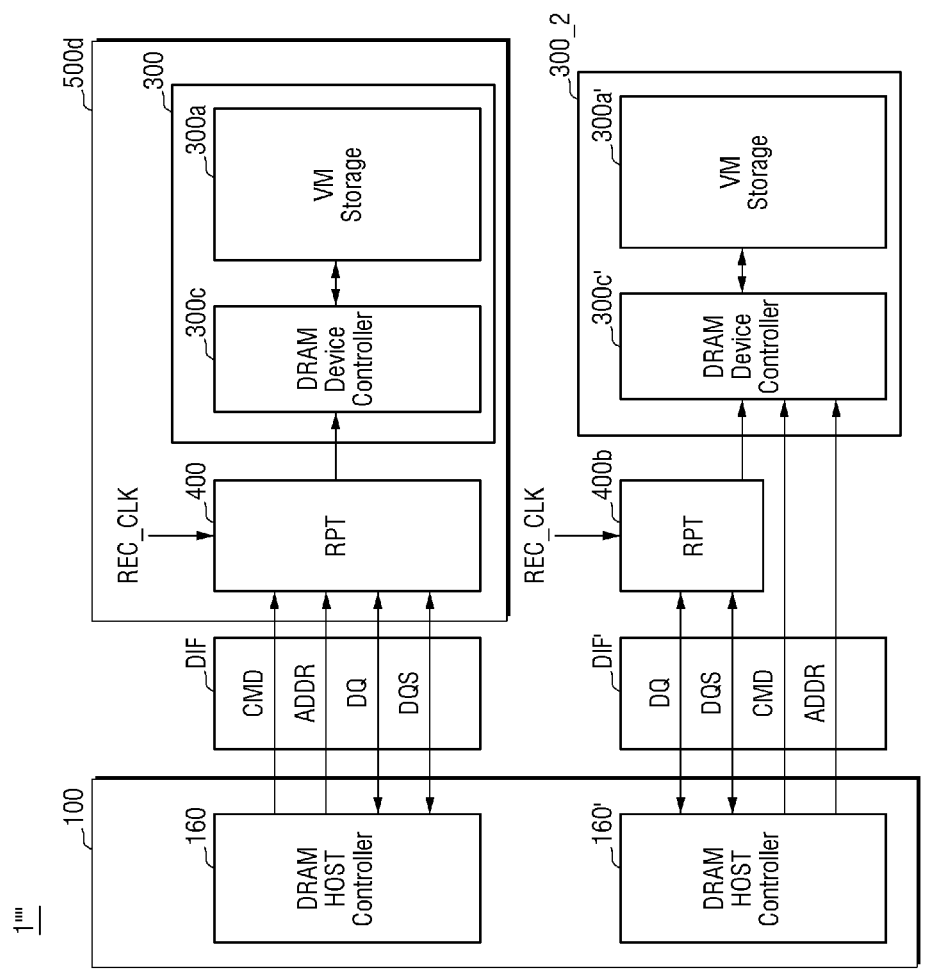
FIG. 17 is a block diagram for explaining the semiconductor chip of FIG. 16.

Referring to FIG. 17, the repeater module 400b may be connected to both the host device 100, the UFS multi-chip package 500d and the second memory device 300_2. That is, the repeater module 400b may receive the signal including the data signal DQ and the data strobe signal DQS from the host device 100, may receive the recovery clock signal REC_CLK from the UFS multi-chip package 500d, and may provide a signal with quality improved to the second memory device 300_2. In this way, the repeater module 400b may be placed on the motherboard MB to be exposed to the outside.

Hereinafter, the operation of the semiconductor chip according to another embodiment will be described referring to FIG. 18.

Figure 18:
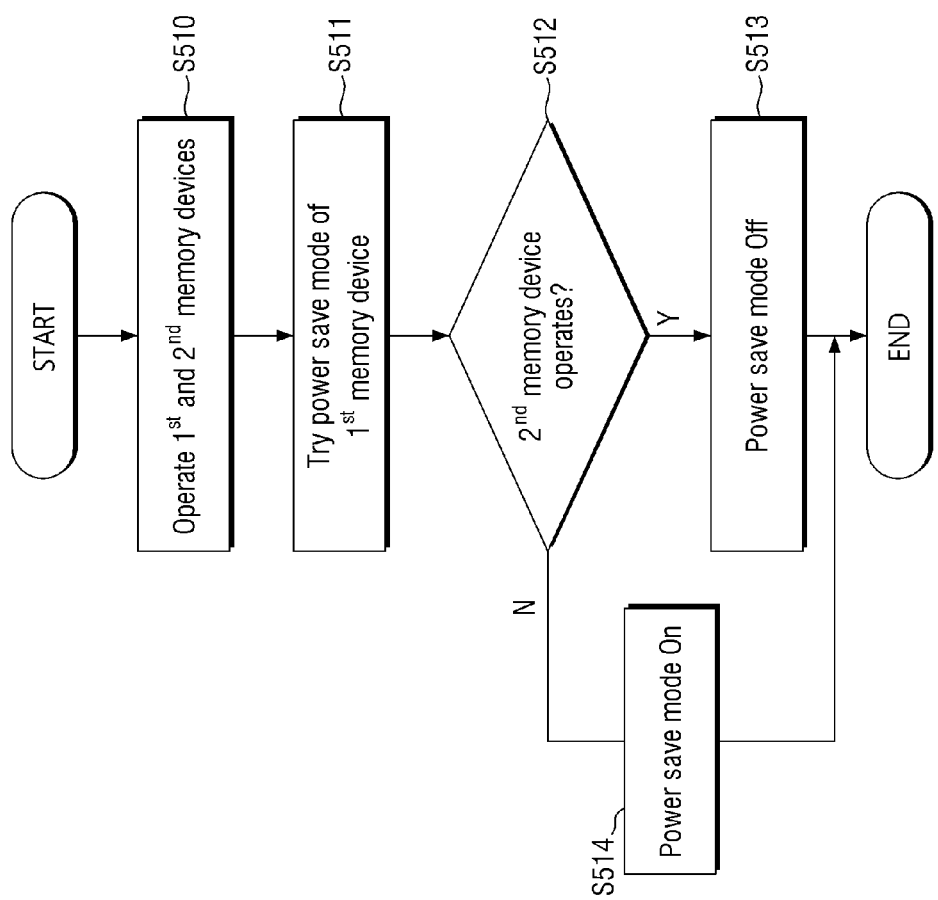
FIG. 18 is a flowchart for explaining the operation of the semiconductor chip according to some embodiments.

FIG. 18 is a flowchart for explaining the operation of the semiconductor chip according to some embodiments. For convenience of explanation, repeated parts of contents explained referring to FIGS. 1 to 17 will be briefly described or omitted.

Referring to FIGS. 2 and 18, both the first memory device 200 and the second memory device 300 may operate (S510). At this time, the second memory device 300 may receive the signal with improved quality through the repeater module 400.

The semiconductor chip 1 may attempt a power save mode of the first memory device 200 (S511). Here, the power save mode is defined as a case where the power is turned off when the first memory device 200 is not accessed from the host device 100. At this time, when the first memory device 200 is in the power save mode, the first memory device 200 may not generate the recovery clock signal REC_CLK, and thus, there is a problem that the signal to be sent to the second memory device 300 is a signal whose quality is not improved.

Subsequently, the semiconductor chip 1 may check whether the second memory device 300 operates (S512). When the second memory device 300 operates (S512-Y), the power save mode of the first memory device 200 may be turned off. Further, when the second memory device 300 does not operate (S512-N), the power save mode of the first memory device 200 may be turned on. That is, when the second memory device 300 operates, the first memory device 200 may continuously operate to improve the quality of the signal sent to the second memory device 300.

Hereinafter, a vehicle 700 including an electronic control unit 710 and a storage 720 according to another embodiment will be described referring to FIG. 19.

Figure 19:
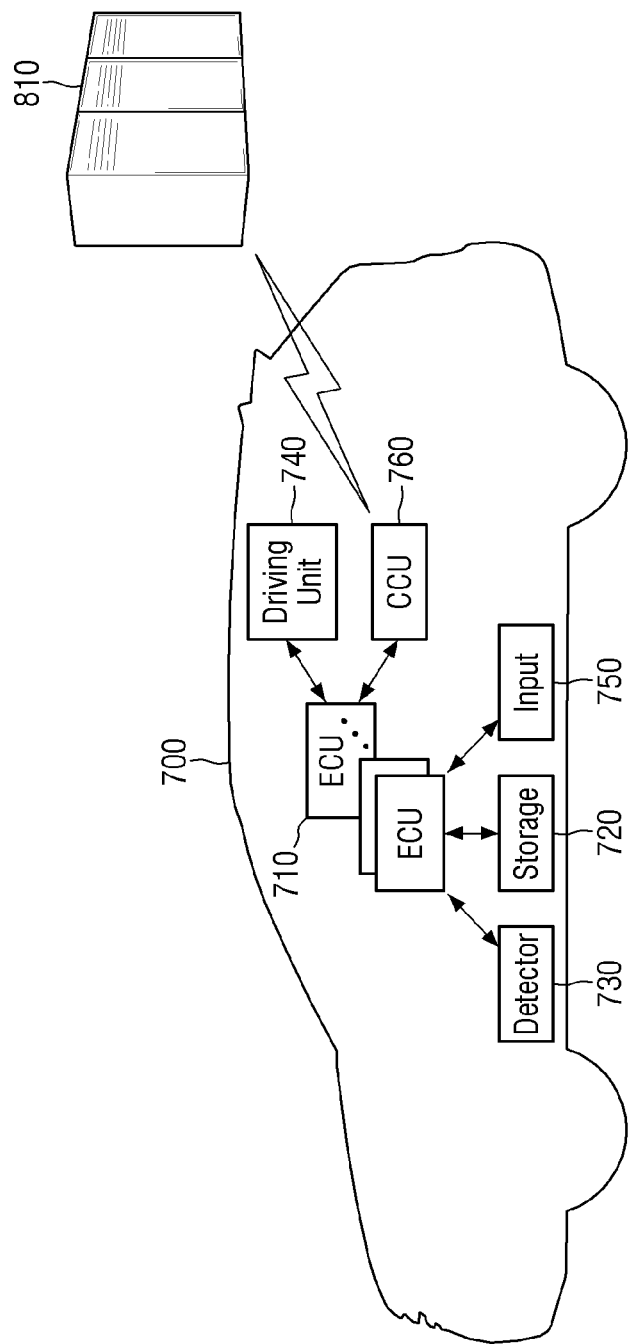
FIG. 19 is a diagram of a vehicle including the semiconductor chip according to some embodiments.

FIG. 19 is a diagram of a vehicle including the semiconductor chip according to some embodiments. For convenience of explanation, repeated parts of contents explained referring to FIGS. 1 to 18 will be briefly explained or omitted.

Referring to FIG. 19, the vehicle 700 may include a plurality of electronic control units (ECU) 710 and a storage 720. At this time, the electronic control unit 710 may correspond to the host device 100 described above and the first memory device 200 and the second memory device 300 may correspond to the storage 720.

Each electronic control unit of the plurality of electronic control units 710 is electrically, mechanically, and communicatively connected to at least one of the plurality of devices provided in the vehicle 700 and may control operation of at least one device on the basis of any one function performance command.

Here, the plurality of devices may include an acquisition device 730 that acquires information required to perform at least one function and a driving unit 740 that performs at least one function.

For example, the acquisition device 730 may include various detection units and image acquisition units and the driving unit 740 may include a fan and a compressor of an air conditioner, a fan of a ventilator, an engine and a motor of a power unit, a motor of a steering device, a motor and a valve of a braking device, an opening and closing device of a door or a tailgate, and the like.

The plurality of electronic control units 710 may communicate with the acquisition device 730 and the driving unit 740, for example, using at least one of Ethernet, low voltage differential signaling (LVDS) communication, and LIN (Local Interconnect Network) communication.

The plurality of electronic control units 710 determine whether it is necessary to perform the function on the basis of information acquired through the acquisition device 730. If it is determined that the function needs to be performed, the plurality of electronic control units 710 control the operation of the driving unit 740 which performs that function and may control an operating amount thereof on the basis of the acquired information. At this time, the plurality of electronic control units 710 may store the acquired information in the storage 720 or read and use the information stored in the storage 720.

The plurality of electronic control units 710 are also able to control the operation of the driving unit 740 that performs the function on the basis of the function performance command input through the input unit 750 and are also able to check a setting amount corresponding to the information input through the input unit 750 and control the operation of the driving unit 740 that performs the function on the basis of the checked setting amount.

Each electronic control unit 710 may control any one function independently or may control any one function in cooperation with another electronic control unit.

For example, if a distance to an obstacle detected through a distance detection unit is within a reference distance, an electronic control unit of a collision prevention apparatus may output a warning sound to a collision with an obstacle through a speaker.

An electronic control unit of an autonomous driving control apparatus receives navigation information, road image information, and distance information from the obstacle in association with the electronic control unit of the vehicle terminal, the electronic control unit of the image acquisition unit, and the electronic control unit of the collision prevention apparatus, and controls the power unit, the braking device, and the steering device, using the received information, thereby performing the autonomous driving.

A connectivity control unit (CCU) 760 is electrically, mechanically, and communicatively connected to each of the plurality of electronic control units 710 and communicates with each of the plurality of electronic control units 710.

That is, the connectivity control unit 760 is able to directly communicate with the plurality of electronic control units 710 provided inside the vehicle, is able to perform communication with an external server 810, and is also able to communicate with an external terminal through an interface.

Here, the connectivity control unit 760 may communicate with a plurality of electronic control units 710 and may communicate with a server 810, using an antenna (not shown) and RF communication.

In addition, the connectivity control unit 760 may communicate with the server 810 by wireless communication. At this time, the wireless communication between the connectivity control unit 760 and the server 810 can be performed through various wireless communication methods such as a GSM (Global System for Mobile Communication), a CDMA (Code Division Multiple Access), a WCDMA (Wideband Code Division Multiple Access), a UMTS (Universal Mobile Telecommunications System), a TDMA (Time Division Multiple Access), and an LTE (Long Term Evolution), in addition to a Wifi module and a wireless broadband module.

Hereinafter, a mobile electronic device 1000 according to another embodiment will be described referring to FIGS. 20 and 21.

Figure 20:
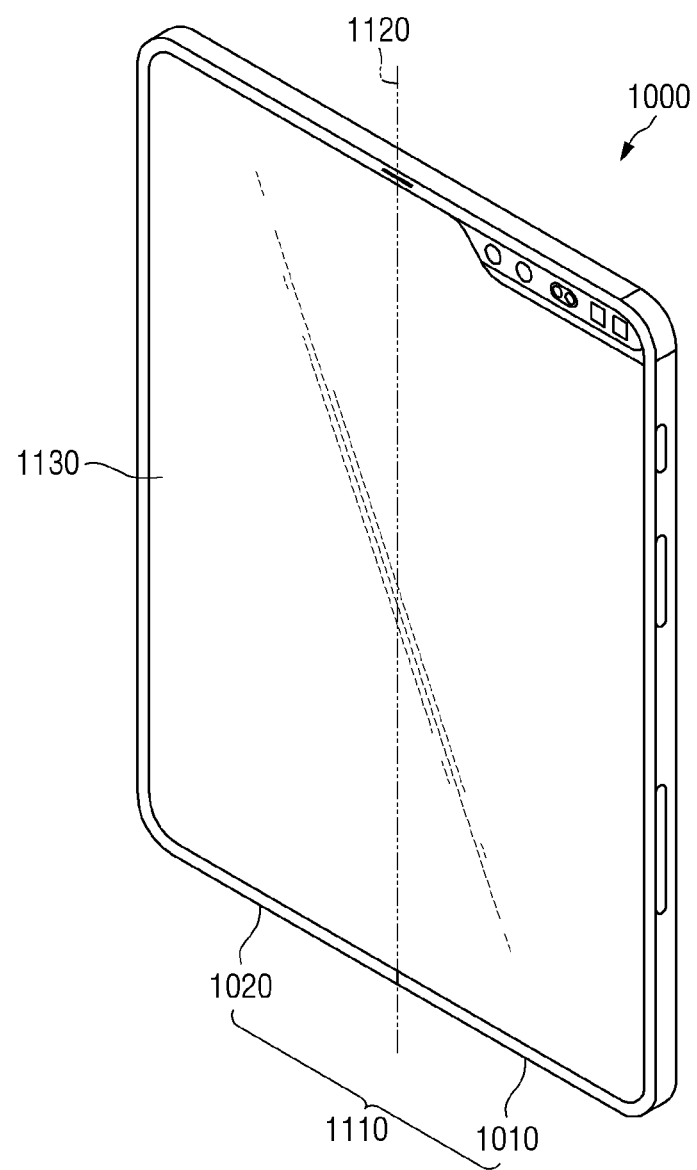
FIG. 20 is a diagram for a mobile electronic device including a semiconductor chip according to some embodiments.

FIG. 20 is a diagram for a mobile electronic device including a semiconductor chip according to some embodiments. FIG. 21 is a block diagram for explaining the mobile electronic device of FIG. 20. For convenience of explanation, repeated parts of contents explained referring to FIGS. 1 to 18 will be briefly explained or omitted.

Referring to FIG. 20, the mobile electronic device 1000 may include a foldable housing 1110 and a display device 1130. Here, the foldable housing 1110 may include a first housing 1010 and a second housing 1020. The foldable housing 1110 may include the first housing 1010 and the second housing 1020 that may be folded along a folding axis 1120. The first housing 1010 and the second housing 1020 may face each other in a folded state.

If the mobile electronic device 1000 is not folded, the first housing 1010 and the second housing 1020 may form a planar structure. At this time, the display device 1130 may also form a planar structure. However, when the mobile electronic device 1000 is folded, the first housing 1010 and the second housing 1020 may face each other.

Figure 21:
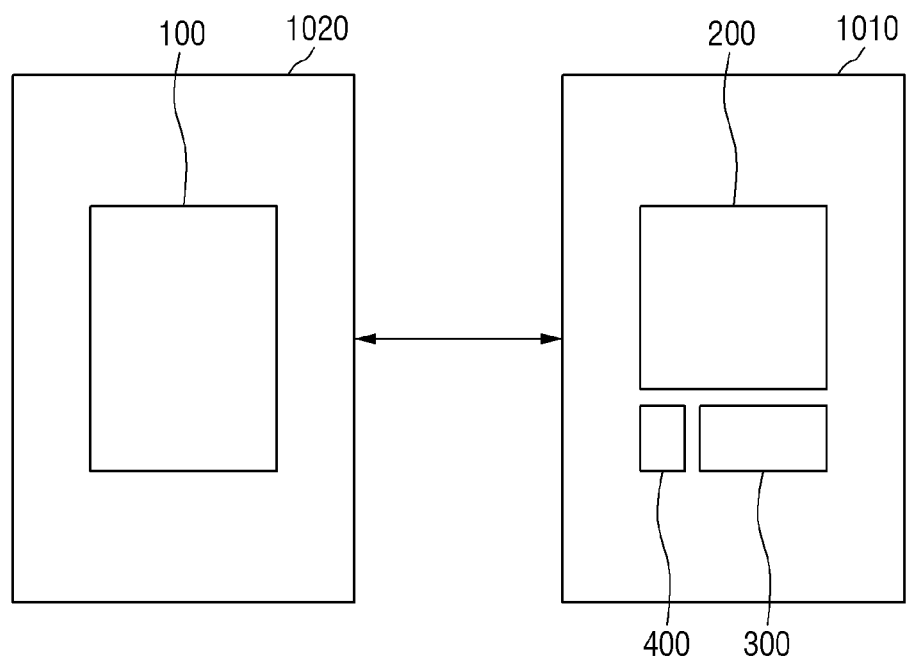
FIG. 21 is a block diagram for explaining the mobile electronic device of FIG. 20.

Referring to FIG. 21, the second housing 1020 may include a host device 100 and the first housing 1010 may include a first memory device 200, a second memory device 300 and a repeater module 400. That is, the first memory device 200, the second memory device 300, and the repeater module 400 may be placed apart from the host device 100. The signal sent from the host device 100 may be improved in quality through the first memory device 200 and the repeater module 400 and sent to the second memory device 300.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor chip comprising:
a host device;
a first memory device which is spaced apart from the host device and connected to the host device;
a repeater module which is connected to the host device and the first memory device; and
a second memory device which is spaced apart from the host device and connected to the repeater module, wherein:
the first memory device receives a data signal from the host device and generates a recovery clock signal using the data signal,
the repeater module receives the recovery clock signal from the first memory device, receives a first input signal from the host device, and samples the first input signal on the basis of the recovery clock signal to generate a sampling signal,
the second memory device receives the sampling signal, and
wherein the first memory device turns off a power save mode when the second memory device operates and turns on the power save mode when the second memory device does not operate.

2. The semiconductor chip of claim 1, wherein a first distance between the host device and the second memory device is greater than a second distance between the first memory device and the second memory device.

3. The semiconductor chip of claim 1, wherein the first memory device includes a non-volatile memory device and the second memory device includes a volatile memory device.

4. The semiconductor chip of claim 3, wherein the first memory device includes a universal flash storage (UFS) memory device and the second memory device includes a dynamic random access memory (DRAM) device.

5. The semiconductor chip of claim 3, wherein the second memory device includes a low-power double data rate (LPDDR) dynamic random access memory (DRAM) device.

6. The semiconductor chip of claim 1, wherein:
the first memory device includes a mobile industry processor interface (MIPI) M-PHY including a clock data recovery circuit, and
the clock data recovery circuit generates the recovery clock signal on the basis of the data signal and a reference clock signal from the host device.

7. The semiconductor chip of claim 1, wherein the repeater module receives an output signal from the second memory device and does not sample the output signal on the basis of the recovery clock signal.

8. The semiconductor chip of claim 1, wherein the second memory device directly receives a second input signal from the host device and the second input signal is different from the first input signal.

9. The semiconductor chip of claim 8, wherein the first input signal includes at least one of a clock signal and a data strobe signal.

10. A semiconductor chip comprising:
a host device; and
a multi-chip package which is spaced apart from the host device and connected to the host device, wherein:
the multi-chip package includes:
a first memory device;
a second memory device different from the first memory device; and a first repeater module which is electrically connected to the first and second memory devices, the first memory device transmits a clock signal to the first repeater module, the first repeater module samples a first input signal from the host device on the basis of the clock signal to generate a sampling signal, the second memory device receives the sampling signal, and wherein the first memory device turns off a power save mode when the second memory device operates and turns on the power save mode when the second memory device does not operate.

11. The semiconductor chip of claim 10, further comprising:

a third memory device which is spaced apart from the host device and electrically connected to the multi-chip package, wherein the third memory device is different from the first memory device.

12. The semiconductor chip of claim 11, wherein:

the third memory device receives the sampling signal from the first repeater module, the third memory device directly receives a second input signal from the host device, and the second input signal is different from the first input signal.

13. The semiconductor chip of claim 12, wherein the sampling signal includes a clock signal or a data strobe signal.

14. The semiconductor chip of claim 11, further comprising:

a second repeater module which electrically connects the multi-chip package and the third memory device, wherein the second repeater module provides the third memory device with a signal obtained by sampling the second input signal from the host device on the basis of the clock signal.

15. The semiconductor chip of claim 11, wherein the first memory device includes a universal flash storage (UFS) memory device and the second and third memory devices include a dynamic random access memory (DRAM) device.

16. The semiconductor chip of claim 11, wherein a first distance between the host device and the multi-chip package is greater than a second distance between the multi-chip package and the third memory device.

17. The semiconductor chip of claim 10, wherein:

the first memory device includes a mobile industry processor interface (MIPI) M-PHY including a clock data recovery circuit, and the clock data recovery circuit generates the clock signal on the basis of a data signal from the host device and a reference clock signal.

18. A vehicle comprising:

an electronic control unit; and a semiconductor chip which receives and stores data from the electronic control unit, wherein:

the semiconductor chip includes:

a universal flash storage (UFS) memory device which is spaced apart from the electronic control unit and connected to the electronic control unit;

a repeater module connected to the electronic control unit and the UFS memory device; and a dynamic random access memory (DRAM) device which is spaced apart from the electronic control unit and connected to the repeater module, the UFS memory device receives a data signal from the electronic control unit and generates a recovery clock signal using the data signal, the repeater module receives the recovery clock signal from the UFS memory device, receives an input signal from the electronic control unit, and samples the input signal on the basis of the recovery clock signal to generate a sampling signal, the DRAM device receives and processes the sampling signal, and wherein the UFS memory device turns off a power save mode when the DRAM device operates and turns on the power save mode when the DRAM device does not operate.

19. The vehicle of claim 18, wherein a first distance between the electronic control unit and the UFS memory device is greater than a second distance between the UFS memory device and the DRAM device.

* * * * *